United States Patent
Kawamura et al.

(10) Patent No.: US 10,781,514 B2
(45) Date of Patent: Sep. 22, 2020

(54) FILM FORMATION DEVICE FOR CUTTING TOOL PROVIDED WITH WITH COATING FILM, AND FILM FORMATION METHOD FOR CUTTING TOOL PROVIDED WITH COATING FILM

(71) Applicant: MITSUBISHI MATERIALS CORPORATION, Tokyo (JP)

(72) Inventors: Masao Kawamura, Tokyo (JP); Toshikatsu Sudo, Tokyo (JP); Atsushi Shinboya, Tokyo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 310 days.

(21) Appl. No.: 15/320,860

(22) PCT Filed: Jun. 26, 2014

(86) PCT No.: PCT/JP2014/067072
§ 371 (c)(1),
(2) Date: Dec. 21, 2016

(87) PCT Pub. No.: WO2015/198458
PCT Pub. Date: Dec. 30, 2015

(65) Prior Publication Data
US 2017/0137931 A1 May 18, 2017

(30) Foreign Application Priority Data
Jun. 24, 2014 (JP) .................................. 2014-129338

(51) Int. Cl.
*C23C 14/50* (2006.01)
*C23C 14/32* (2006.01)
(Continued)

(52) U.S. Cl.
CPC ............ *C23C 14/325* (2013.01); *B23P 15/28* (2013.01); *C23C 14/022* (2013.01); *C23C 14/50* (2013.01);
(Continued)

(58) Field of Classification Search
CPC ........ C23C 14/50; C23C 14/56; C23C 14/568
See application file for complete search history.

(56) References Cited

U.S. PATENT DOCUMENTS 5,460,853 A * 10/1995 Hintz ...................... C23C 14/20
118/729
5,961,798 A * 10/1999 Robinson .............. C23C 14/568
118/719
(Continued)

FOREIGN PATENT DOCUMENTS

| JP | 03-191063 A | 8/1991 |
| JP | 03191063 A * | 8/1991 |

(Continued)

OTHER PUBLICATIONS

Machine Translation of JP-03191063-A, retrieved 2019.*
(Continued)

*Primary Examiner* — David P Turocy
(74) *Attorney, Agent, or Firm* — Locke Lord LLP; James E. Armstrong, IV; Nicholas J. DiCeglie, Jr.

(57) ABSTRACT

A deposition apparatus for cutting tools with a coating film capable of depositing the coating film in an appropriate temperature condition is provided. The deposition apparatus includes: a deposition chamber in which a coating film is formed on the cutting tools; a pre-treatment chamber and post-treatment chamber, each of which is connected to the deposition chamber through a vacuum valve; and a conveying line that conveys the cutting tools from the pre-treatment chamber to the post-treatment chamber going through the
(Continued)

deposition chamber, the in-line deposition apparatus using a conveyed carrier on which rods supporting cutting tools are provided in a standing state along a conveying direction. The deposition chamber includes: a deposition region; a conveying apparatus; a heating region; and a carrier-waiting region.

4 Claims, 20 Drawing Sheets

(51) Int. Cl.
  *B23P 15/28* (2006.01)
  *C23C 14/02* (2006.01)
  *C23C 14/56* (2006.01)
  *C23C 14/54* (2006.01)
(52) U.S. Cl.
  CPC .......... *C23C 14/505* (2013.01); *C23C 14/541* (2013.01); *C23C 14/568* (2013.01)

(56) References Cited

U.S. PATENT DOCUMENTS

2006/0006059 A1* 1/2006 Kohara ............... C23C 14/0036
                                                    204/192.15
2007/0275268 A1* 11/2007 Takaoka ................. C22C 26/00
                                                    428/698
2009/0061088 A1   3/2009 Von Der Waydbrink et al.
2012/0009348 A1   1/2012 Xia et al.

FOREIGN PATENT DOCUMENTS

| JP | 05-117851 A   | 5/1993  |
| JP | 07-078526 A   | 3/1995  |
| JP | 07-272852 A   | 10/1995 |
| JP | 08--008213 A  | 1/1996  |
| JP | 08-329458 A   | 12/1996 |
| JP | 10-140351 A   | 5/1998  |
| JP | 2004-225065 A | 8/2004  |
| JP | 2008-101254 A | 5/2008  |

OTHER PUBLICATIONS

International Search Report dated Aug. 19, 2014, issued for PCT/JP2014/067072 and English translation thereof.

Supplemental European Search Report dated Nov. 7, 2017, issued for the European patent application No. 14895964.6.

* cited by examiner

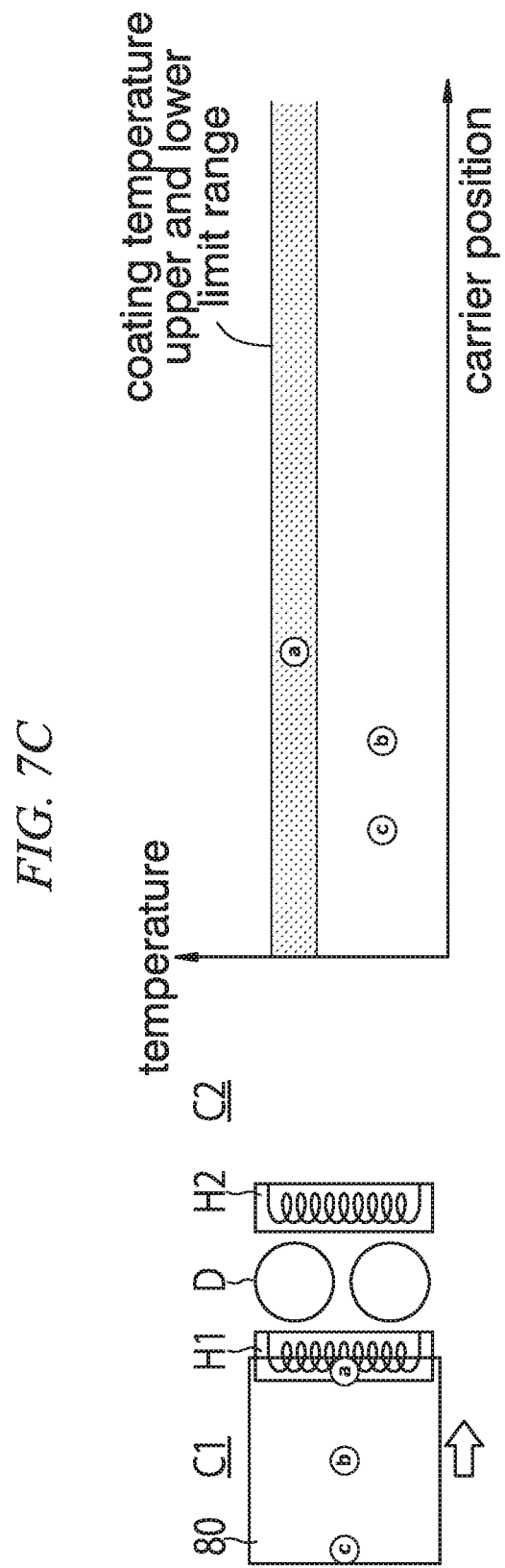

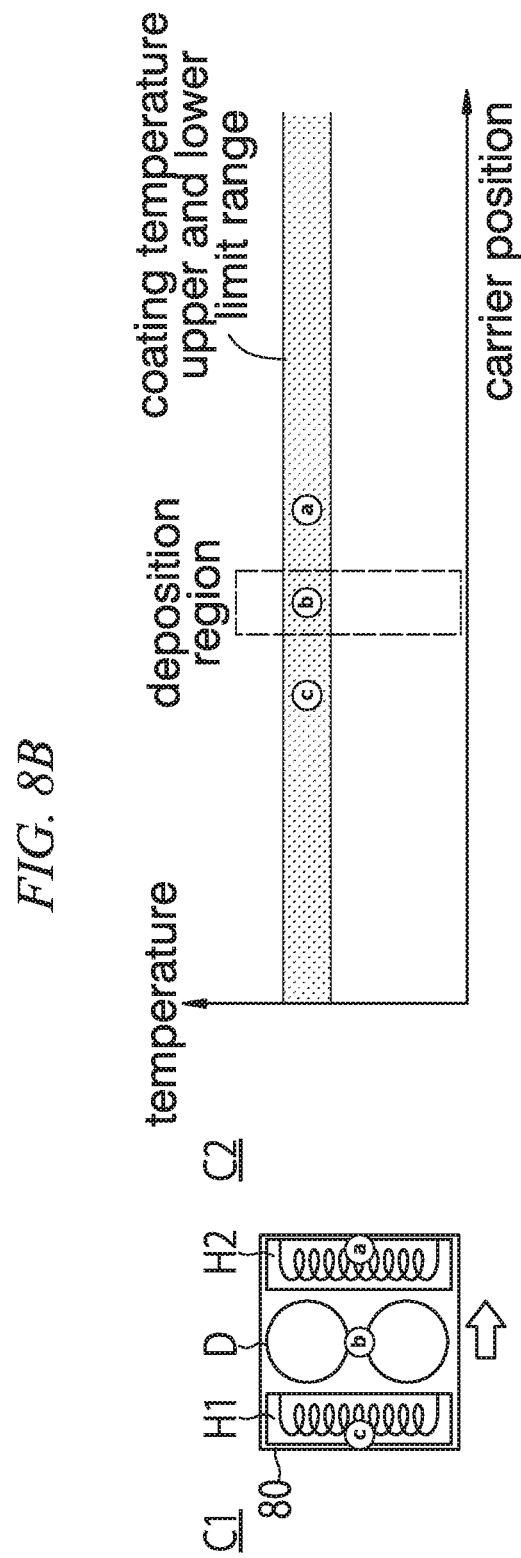

FILM FORMATION DEVICE FOR CUTTING TOOL PROVIDED WITH WITH COATING FILM, AND FILM FORMATION METHOD FOR CUTTING TOOL PROVIDED WITH COATING FILM

TECHNICAL FIELD

The present invention relates to a deposition apparatus for a cutting tool with a coating film and a deposition method of a coating film of a cutting tool.

Priority is claimed on Japanese Patent Application No. 2014-129338, filed Jun. 24, 2014, the content of which is incorporated herein by reference.

BACKGROUND ART

As a deposition apparatus, the in-line vacuum deposition apparatus described in Patent Literature 1 (PTL 1) is known, for example. In this type of the deposition apparatus, the coating film is formed on the surface of the cutting tool by conveying a pallet pass in one direction for the pallet to pass a deposition region.

CITATION LIST

Patent Literature

PTL 1: Japanese Unexamined Patent Application, First Publication No.

SUMMARY OF INVENTION

Technical Problem

When a coating film is formed on a cutting tool by using the in-line deposition apparatus, the cutting tool is heated by a heater in the pre-treatment chamber provided in the upstream stage of the deposition chamber where the coating film is formed on the cutting tool. However, the quality of the coating film is deteriorated occasionally due to low temperature in the early stage of deposition because of: the conveying period of the cutting tool from the pre-treatment chamber to the deposition chamber; reduction of cutting tool temperature in the waiting period on the pallet in the deposition chamber; or the like. On the other hand, when the cutting tool is heated at high temperature in advance in order to obtain an appropriate surface temperature in the beginning of deposition, it is possible that the temperature exceeds the upper limit of the appropriate temperature range due to excessively increased temperature during deposition. In such a case with temperature fluctuation, quality of the film differs on the substrate side and the surface side of the cutting tool; and cutting performance corresponding to its film thickness cannot be obtained. In addition, it could cause peeling-off of the coating film when the quality of the film on the substrate side is inferior.

In addition, temperature difference between the cutting tool on the front side of the pallet and one on the rear side of the pallet is formed during deposition, since the coating film is formed while the pallet is conveyed; and it is likely that dispersion of the film quality is formed. This leads to dispersion of cutting performance among products with the same specification. Thus, the recommended cutting condition for the products is determined based on the coating film with the worst performance.

The purpose of the present invention is to provide: a deposition apparatus for a cutting tool with a coating film capable of depositing the coating film in an appropriate temperature condition; and a deposition method of a coating film of the cutting tool.

Solution to Problem

According to a first aspect of the present invention, an in-line deposition apparatus for a cutting tool with a coating film including, a deposition chamber in which a coating film is formed on the cutting tools;

a pre-treatment chamber and post-treatment chamber, each of which is connected to the deposition chamber through a vacuum valve; and a conveying line that conveys the cutting tools from the pre-treatment chamber to the post-treatment chamber going through the deposition chamber, the in-line deposition apparatus using a conveyed carrier on which rods supporting cutting tools are provided in a standing state along a conveying direction, wherein the deposition chamber includes:

a deposition region in which the coating film is formed on the cutting tools;

a conveying apparatus that conveys the conveyed carrier along the conveying line for the conveyed carrier to pass through the deposition region;

a heating region that is placed adjacent to the deposition region in the carrier conveying direction, the cutting tools being heated in the heating region; and a carrier-waiting region that accommodates the conveyed carrier between the deposition region and the vacuum valve, is provided.

In the deposition apparatus of the first aspect of the present invention, targets may be provided to the deposition region in such a way that the targets sandwiches the conveying line for the conveyed carrier, and heating apparatuses may be provided to the heating region in such a way that the heating apparatuses sandwiches the conveying line for the conveyed carrier.

In addition, the heating region may be provided to each of both sides of the deposition region in the carrier conveying direction.

In addition, deposition regions may be provided along the carrier conveying direction.

In addition, the heating region may be provided to each of both sides of the deposition regions in the carrier conveying direction.

In addition, deposition regions and heating regions may be provided alternatingly along the carrier conveying direction, and the heating region may be provided to each of both sides of the deposition region in the carrier conveying direction.

In addition, a length between two hating regions provided to each of both sides of one or more deposition regions is shorter than a length of the conveyed carrier in the conveying direction.

In addition, the deposition apparatus may be configured that the number of the deposition regions provided continuously in the conveying direction may be 3 or less. In addition, the deposition apparatus may be configured that the number of the deposition regions provided continuously in the conveying direction may be 2 or less.

In addition, the conveyed carrier may be provided with a rotating body that rotates the cutting tools.

In addition, a carrier-waiting region accommodating at least one conveyed carriers may be provided between the heating region and the vacuum valve.

In addition, a width of the heating region in the conveying direction may be shorter than the length of the conveyed carrier in the conveying direction.

According to the second aspect of the present invention, a deposition method for forming a coating film on a surface of a cutting tool by using an in-line deposition apparatus for a cutting tool with a coating film including: a deposition chamber in which a coating film is formed on the cutting tools; a pre-treatment chamber and post-treatment chamber, each of which is connected to the deposition chamber through a vacuum valve; and a conveying line that conveys the cutting tools from the pre-treatment chamber to the post-treatment chamber going through the deposition chamber, the in-line deposition apparatus using a conveyed carrier on which rods supporting cutting tools are provided in a standing state along a conveying direction, the deposition method including the steps of:

mounting the cutting tools on the conveyed carrier;

sending the conveyed carrier in the deposition chamber; and conveying the conveyed carrier in the deposition chamber along the conveying direction for the conveyed carrier to pass through the heating region, in which the cutting tools are heated, and the deposition region, in which the coating film is formed, in order, is provided.

In the deposition method of the second aspect of the present invention, the cutting tools may be heated in the heating region from both sides sandwiching the conveying line, and the coating film may be deposited in the deposition region from both sides sandwiching the conveying line In addition, a multi-layered coating layer may be formed on the cutting tools by providing the heating region to each of both sides of the deposition region in the conveying direction of the conveyed carrier; and reciprocally moving the conveyed carrier in a region including the heating regions and the deposition region.

In addition, a multi-layered coating layer may be formed on the cutting tools by providing deposition regions along the conveying direction of the conveyed carrier; and having the conveyed carrier pass the deposition regions in order.

In addition, the conveyed carrier alternatingly may pass the heating regions and the deposition regions along the conveying direction of the conveyed carrier.

In addition, the coating layer may be deposited while the cutting tools are rotated on the conveyed carrier.

Advantageous Effects of Invention

According to the present invention, a deposition apparatus for cutting tools with a coating film capable of depositing the coating film in an appropriate temperature condition; and a deposition method of a coating film of the cutting tool are provided.

BRIEF DESCRIPTION OF DRAWINGS

FIG. 7C is an explanatory drawing of the coating step in the deposition chamber.

FIG. 8B is an explanatory drawing of the coating step in the deposition chamber.

DESCRIPTION OF EMBODIMENTS

The deposition apparatus and the deposition method relating to the embodiments of the present invention are explained below in reference to drawings.

First Embodiment

Figure 1:
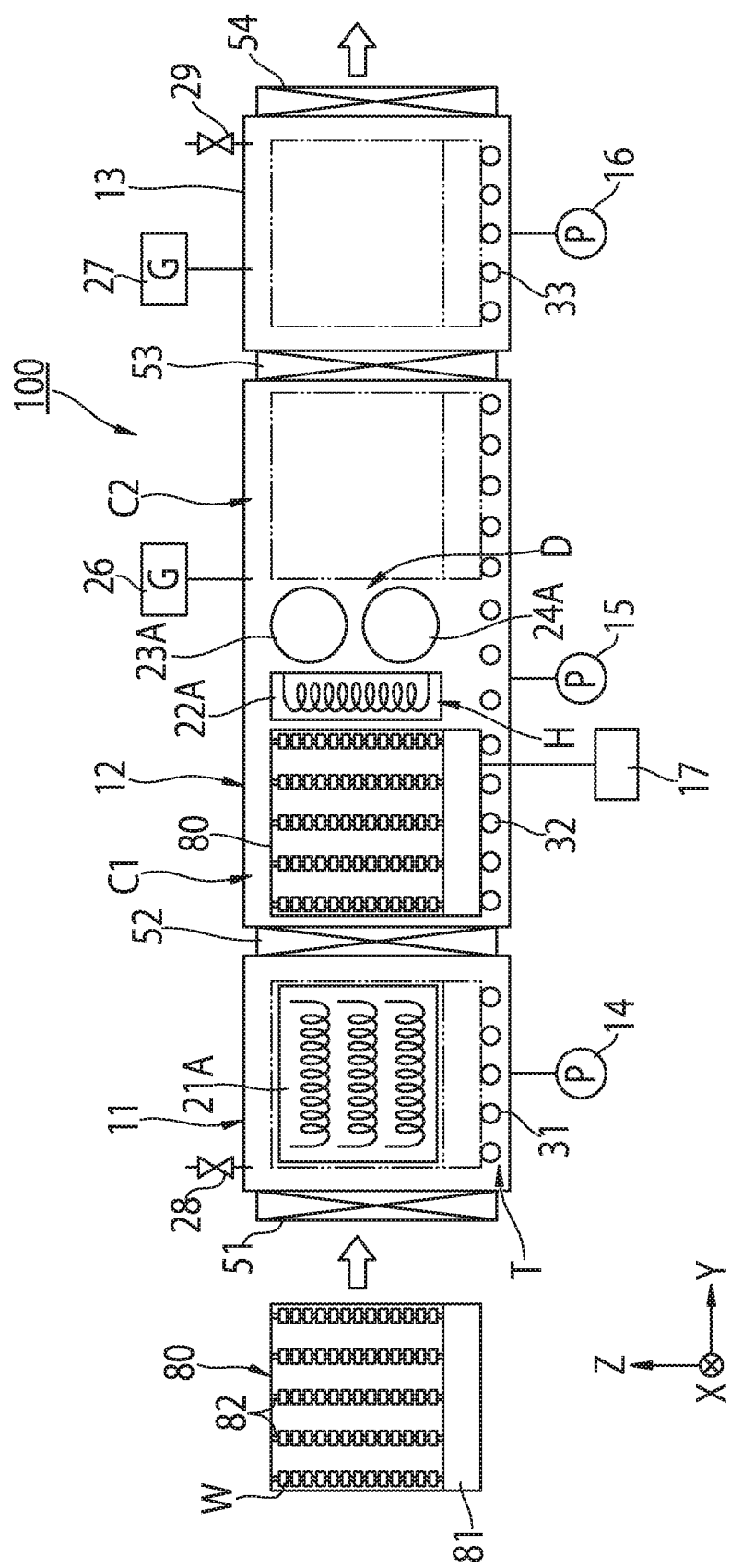
FIG. 1 is the side view showing the internal structure of the deposition apparatus relating to the first embodiment of the present invention.
Figure 2:
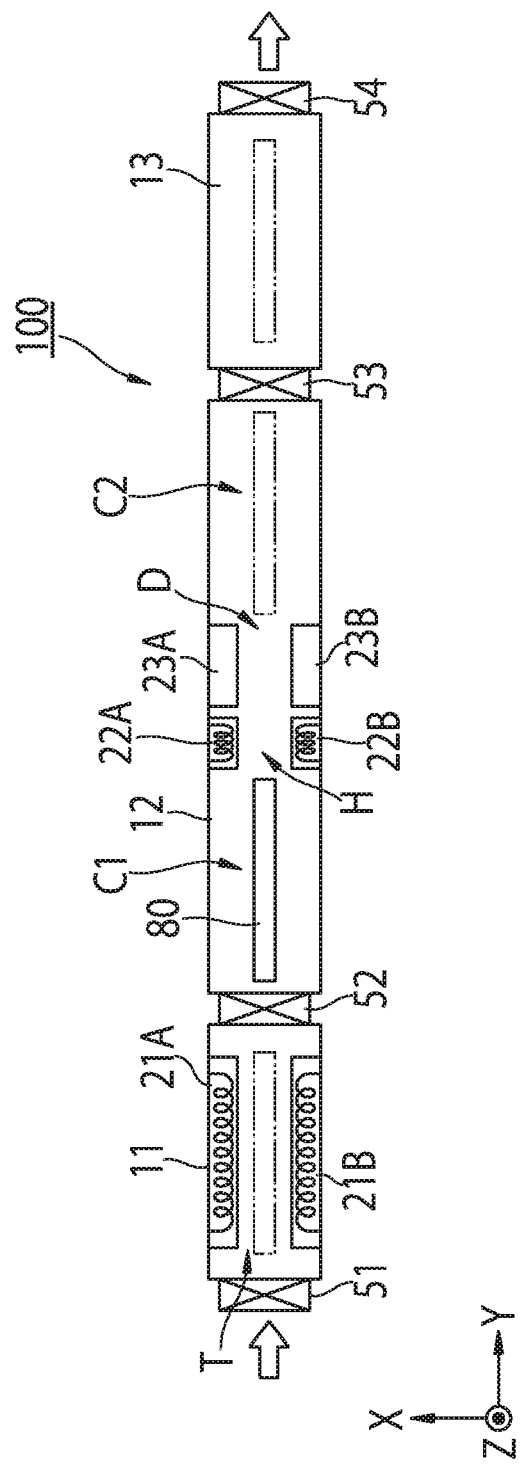
FIG. 2 is the top view showing the internal structure of the deposition apparatus relating to the first embodiment of the present invention.

FIG. 1 is the side view showing the internal structure of the deposition apparatus relating to the first embodiment of the present invention. FIG. 2 is the top view showing the internal structure of the deposition apparatus relating to the first embodiment of the present invention.

The deposition apparatus 100 in the present embodiment is an in-line deposition apparatus in which the conveyed carrier 80 mounting the cutting tools W is conveyed and deposition treatment is performed to the cutting tools W.

As shown in FIG. 1, the conveyed carrier 80 includes the frame 81 in a rectangular frame shape and multiple rods 82 (five rods in the drawing) provided in the frame 81 in the standing state. The cutting tools 82, on which the coating film (the coating film of the cutting tool) is formed, are supported by each of the rods 82 by being skewered with each of the rods 82.

Figure 3:
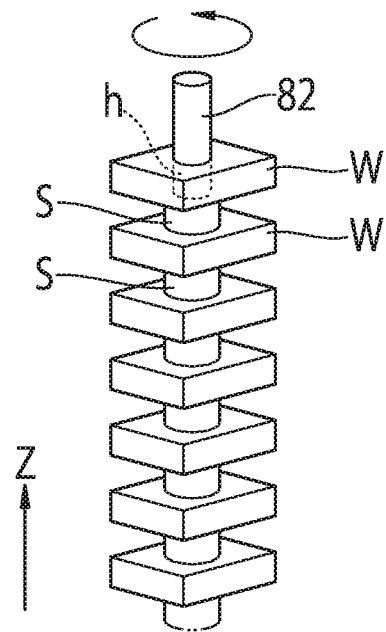
FIG. 3 is an illustration showing how the cutting tools are supported.

FIG. 3 is an illustration showing how the cutting tools are supported. A number of cutting tools W is provided to the rod 82 in the state where the spacer S in an annular ring shape is interposed between adjacent cutting tools W. The rod 82 is rotatable about the axis. A rotation body, which rotates the rod 82 and is not shown in the drawing, is provided to the frame 81. As a body for rotating the rod 82, the configuration, in which a driven gear rotating with movement of the conveyed carrier 80 is provided and driving force is transmitted from the driven gear to the rod 82, can be taken, for example.

In the present embodiment, the cutting tool W is the cutting insert used for the cutting edge-replaceable cutting tool. The cutting insert is a part of a polygonal plate formed from a hard material such as cemented carbide and the like. The circular mounting hole is formed for mounting on the main body of the cutting tool. In the present embodiment, the rod 83 inserts through the mounting hole h of the cutting tool W, which is the cutting insert, as shown in FIG. 3.

The deposition apparatus 100 includes the pre-treatment chamber 11, the deposition chamber 12, and the post-treatment chamber 13 as shown in FIGS. 1 and 2. The pretreatment chamber 11 and the deposition chamber 12 are connected through the vacuum valve 52. The deposition chamber 12 and the post-treatment chamber 13 are connected through the vacuum valve 53. The entrance-side gate valve 51, which is for introducing the conveyed carrier 80 in the deposition apparatus 100, is provided to the pre-treatment chamber 11. The exit-side gate valve 54, which is for discharging the conveyed carrier 80, is provided to the post-treatment chamber 13.

The roller conveyers 31-33 (the conveying apparatus), in which multiple conveying rollers are provided in parallel, are laid on the bottom part side of the pre-treatment chamber 11, the deposition chamber 12, and the post-treatment chamber 13. The conveyed carrier 80 is conveyed on the roller conveyers 31-33. In the present embodiment, the passage of the conveyed carrier 80 on the roller conveyers 31-33 constitutes the straight carrier conveying line T. The conveyed carrier 80 mounting the cutting tools W is conveyed in order of: the pre-treatment chamber 11; the deposition chamber 12; and the post-treatment chamber 13, along the carrier conveying line T.

Going back to FIG. 1, the vacuum pump 14 and the air-releasing valve 28 are connected to the pre-treatment chamber 11. The heater 21A and the heater 21B for heating each of conveyed carriers 80 for the cutting tools W are provided to the pre-treatment chamber 11. In the present embodiment, the cutting tools w are heated from the both sides of the conveyed carrier 80 by the heaters 21A and 21B. The heaters 21A and 21B have roughly the same width as the length of the conveyed carrier 80 in the carrier conveying direction (the direction Y in the drawing). In addition, in the vertical direction (the direction Z in the drawing), the heaters 21A and 21B have roughly the same height as the region, in which the cutting tools W on the conveyed carrier 80 are retained. In other words, the heaters 21A and 21B are capable of heating all of the cutting tools W on the conveyed carrier 80 at the same time.

The vacuum pump 15, the gas source 26, and the bias electricity source 17 are connected to the deposition chamber 12. The carrier-waiting region C1; the heating region H; the deposition region D; and the carrier-waiting region C2, are provided in the deposition chamber 12 in order along the carrier conveying line T.

In the present specification, "the deposition region" indicates the region having a function to form a single layer of the coating film on the surface of the cutting tool W in the deposition chamber. Thus, even in the case where the number and the arrangement of targets are changed, it is defined as one "deposition area" as long as the single layer of the coating layer is formed on the surface of the cutting tool W by these targets. For example, multiple same kind targets may be aligned in the carrier conveying direction (the direction Y) in the deposition region D.

The carrier-waiting region C1 is the region where the conveyed carrier 80 temporally stops in front side of the heating region H. The carrier-waiting region C2 is the region where the conveyed carrier 80 temporally stops after formation of the coating film. The carrier-waiting region C1 is formed in the length capable of accommodating the conveyed carrier 80 between the vacuum valve 52 and the deposition region D. It is preferable that the carrier-waiting region C1 is formed in the length capable of accommodating the conveyed carrier 80 between the vacuum valve 52 and the heating region H. The carrier-waiting region C2 is formed in the length capable of accommodating the conveyed carrier 80 between the deposition region D and the vacuum valve 53.

The heating region H is the region for heating the cutting tools W immediately before the deposition region D. the heater 22A (heating apparatus) and the heater 22B (heating apparatus) are provided to the heating region H in such a way that they sandwich the carrier conveying line T. In the present embodiment, the cutting tools W are heated by having the conveyed carrier 80 pass between the heaters 22A and 22B. Thus, the widths of the heaters 22A and 22B in the carrier conveying direction (the direction Y) are shorter than the length of the conveyed carrier 80 (in the direction Y). On the other hand, the heights of the heaters 22A and 22B (in the direction Z) are roughly the same as the region in which the cutting tools W on the conveyed carrier 80 are retained.

The deposition region D is the region in which the coating treatment is performed to the cutting tools W by the arc ion plating method. In the present embodiment, 4 targets are provided to the deposition region D. As shown in FIG. 2, one pair of targets 23A, 23B is provided in such a way that they face each other across the carrier conveying line T. As shown in FIG. 1, the target 24A is provided vertically downward to the target 23A (−Z direction). A target facing the target 24A is provide vertically downward to the target 23B too although it is now shown in the drawing.

In the present embodiment, the deposition region D is formed by providing multiple circular targets. However, the present invention is not limited by the description. Targets with a long rectangular shape in the vertical direction of the deposition chamber 12 (the direction Z in the drawing) may be used, for example. Alternatively, 3 or more targets may be provided in the vertical direction of the deposition chamber 12.

The arc power source, which supplies arc-discharging electrical power to the targets (23A, 23B, 24A) and is not shown in the drawing, is further provided to the deposition region D. The bias power source 17 applies bias voltage to the cutting tools W through the conveyed carrier 80 when the conveyed carrier 80 is positioned in the deposition region D at least.

The vacuum pump 16, the air-releasing valve 29, and the gas source 27 are connected to the post-treatment chamber 13. The post-treatment chamber 13 is the cooling chamber in which the cutting tools W and the conveyed carrier 80 after the coating treatment are cooled down. The gas source 27 supplies the cooling gas for carrier cooling in the post-treatment chamber 13.

Next, the deposition method using the deposition apparatus 100 of the present embodiment is explained.

First, the cutting tools W are mounted on the conveyed carrier 80 as shown in FIG. 1. At this time, the vacuum valves 52, 53 are closed in the deposition apparatus 100; and the pre-treatment chamber 11, the deposition chamber 12, and the post-treatment chamber 13 are kept in a predetermined vacuum state (for example, about $1\times10^{-5}$ Pa).

Next, the air-releasing valve 28 of the pre-treatment chamber 11 is opened, and the inside of the pre-treatment chamber 11 is turned into the atmospheric pressure. Then, the entrance-side gate valve 51 is opened in the state where the inside of the pre-treatment chamber 11 is in the atmospheric pressure; and the conveyed carrier 80 is introduced in the pre-treatment chamber 11. The conveyed carrier 80 is stopped at the position where the mounted cutting tools W directly face the heaters 21A, 21B. Then, the entrance-side gate valve 51 is closed. Next, the vacuum pump 14 is turned on; and exhaustion is performed until the inside of the pre-treatment chamber 11 is turned into a predetermined vacuum level (for example, about $1\times10^{-3}$ Pa).

After obtaining the predetermined vacuum level in the pre-treatment chamber 11, the heaters 21A, 21B are turned on to heat the cutting tools W and the conveyed carrier 80 to a predetermined temperature. In the present embodiment, the cutting tools W can be heated evenly from both sides by the heaters 21A, 21B. In the heating treatment, the cutting tools W may be rotated about the axis of the rod 82.

After heating the cutting tools W to the predetermined temperature, the vacuum valve 52 is opened. Then, the conveyed carrier 80 is moved from the pre-treatment chamber 11 to the deposition chamber 12. The conveyed carrier 80 is stopped in the carrier-waiting region C1 in the deposition chamber 12. After introducing the conveyed carrier 80, the vacuum valve 52 is closed. Then, in order to introduce the next conveyed carrier 80 in the pre-treatment chamber 11, the air-releasing valve 28 is opened; and the inside of the pre-treatment chamber 11 is turned into the atmospheric pressure again. Then, the entrance-side gate valve 51 is opened to introduce the next conveyed carrier 80; and the above-described operation is repeated.

Figure 4:
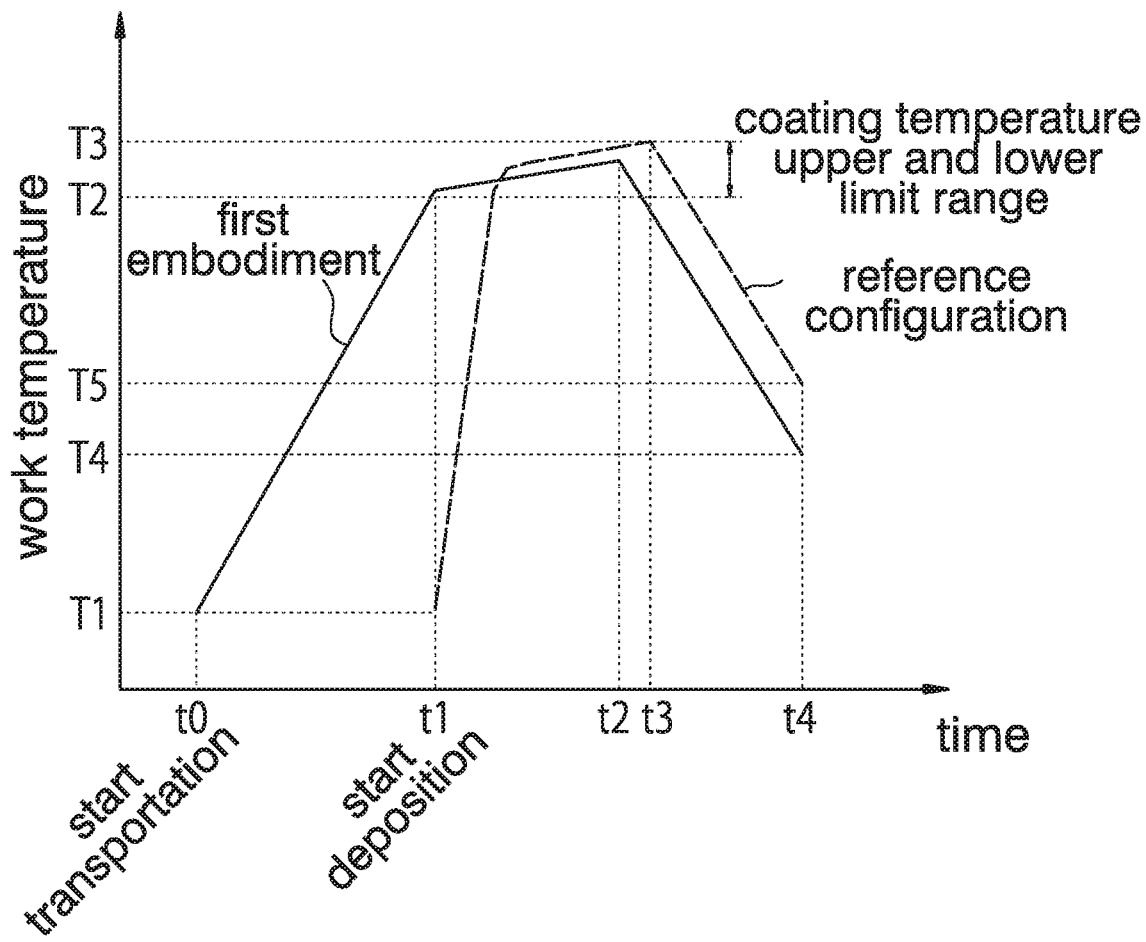
FIG. 4 is an explanatory chart showing temperature change of the cutting tool W in the deposition chamber.

Next, the coating treatment on the cutting tools W is performed in the deposition chamber 12. FIG. 4 is an explanatory chart showing temperature change of the cutting tool W in the deposition chamber 12. Explanation is made in reference to FIGS. 1, 2, and 4 below.

The heaters 22A, 22B are turned on in the deposition chamber 12 in the state where the conveyed carrier 80 is held at the carrier-waiting region C1. Then, conveying of the conveyed carrier 80 to the side of the hating region H is started. The cutting tools W on the conveyed carrier 80 are heated by the heaters 22A, 22B during passing through the heating region H. As shown in FIG. 4, the cutting tools W are heated to the temperature suitable for coating (temperature higher than the lower limit temperature T2) during passing through the rear end of the heating region H (end in +Y direction).

Therefore, the widths of the heaters 22A, 22B (length in the direction Y) is set to the length capable of heating the cutting tools W to the set temperature at an intended heating rate during the cutting tools W passing through the heating region H.

The heaters 22A, 22B can adjust the temperature of the cutting tools W immediately before deposition. If the widths of the heaters 22A, 22B were set excessively wide, energy consumption would be increased. In addition, if the heaters 22A, 22B were provided too close to the vacuum valve 52 by having too wide widths, it would be possible that the operational stability of the vacuum valve 52 is deteriorated by heat. Thus, it is preferable that the widths of the heaters 22A, 22B are shorter than the width of the conveyed carrier 80 (length in the direction Y) in view of energy efficiency and operational stability of the vacuum valve 52.

Before the front end of the conveyed carrier 80 moves beyond the heating region H, the deposition region D is put in the state capable of performing deposition on the cutting tools W. Specifically, a predetermined bias voltage (−300V, for example) is applied on the cutting tools W from the bias electricity source 17 through the frame 81. In addition, the process gas is supplied in the deposition chamber 12 from the gas source 26; and the pressure condition is controlled (0.3 to 1 Pa, for example) for the arc-discharge to be generated on the surfaces of the targets 23A, 23B, 24B.

After being heated to the predetermined temperature in the heating region H, the cutting tools W pass the deposition region D continuously. The coating film having an intended composition is formed on the surfaces of the cutting tools W during the cutting tools W passing the deposition region D. For example, when a Ti target is used as the target and $N_2$-containing gas is used as the process gas, a TiN film is formed on the surface of the cutting tool W. The layer thickness and uniformity of the coating film can be controlled by the bias voltage, the pressure, the conveying speed of the conveyed carrier 80, the rotation rate of the cutting tools W and the like.

After the conveyed carrier 80 pass through the deposition region D, application of the bias voltage on the cutting tools W and the arc-discharge are stopped. The conveyed carrier 80 is stopped at the carrier-waiting region C2 in the deposition chamber 12. The surface temperature of the cutting tool W continues to rise even in deposition as shown in FIG. 4. However, after completion of deposition by the cutting tools W passing through the deposition region D, the temperature starts to fall.

Next, the vacuum valve 53 between the deposition chamber 12 and the post-treatment chamber 13 is opened; and the conveyed carrier 80 is sent to the post-treatment chamber 13. After introducing the conveyed carrier 80 to the post-treatment chamber 13, the vacuum valve 53 is closed. In this conveying operation, operations of: opening the vacuum valve 52 between the pre-treatment chamber 11 and the deposition chamber 12; and introducing the next conveyed carrier 80 in the deposition chamber 12, may be performed concurrently.

The conveyed carrier 80 introduced from the deposition chamber 12 is stopped and cooled down in the post-treatment chamber 13. The cooling treatment is performed by retaining the conveyed carrier 80 at a predetermined pressure for a predetermined time, while the cooling gas is supplied to the chamber from the gas source 27. As the cooling gas, an inert gas may be used.

After completion of the cooling treatment, the air-releasing valve 29 is opened; and the inside of the post-treatment chamber 13 is turned into the atmospheric pressure again. Then, the exit-side gate valve 54 is opened; and the conveyed carrier 80 is taken out from the post-treatment chamber 13. After taking out the conveyed carrier 80, the exhausting operation with the vacuum pump 16 is performed in the post-treatment chamber 13. Then, the inside of the post-treatment chamber 13 is kept at a predetermined vacuum level (for example, about $1\times10^{-3}$ Pa) until the next conveyed carrier 80 is introduced.

The pre-treatment chamber 11, the deposition chamber 12, and the post-treatment chamber 13 of the deposition apparatus 100 of the present embodiment can be placed in the state where each of them accommodate one conveyed carrier 80. In this state, the heating treatment in the pre-treatment chamber 11; the coating treatment in the deposition chamber 12; and the cooling treatment in the post-treatment chamber 13 are performed concurrently. By conveying the conveyed carrier 80 and repeating the heating treatment; the coating treatment; and the cooling treatment, in each chamber, coating of the cutting tools W can be performed efficiently.

According to the above-explained deposition apparatus 100 of the first embodiment, the cutting tools W can be heated to the predetermined temperature immediately before deposition by providing the heating region H on the front side of the deposition region D of the deposition chamber 12 in the carrier conveying direction (the side of the direction Y in the drawing). Because of this, the temperature of all of the cutting tools W on the conveyed carrier 80 can be adjusted to a constant temperature immediately before coating.

In the case where the heating region H is not provided to the deposition chamber 12, the temperature of the cutting tools W on the conveyed carrier 80 immediately after heating in the pre-treatment chamber 11 is roughly uniform. However, there is time difference from being heated to entering in the deposition region D between the cutting tool W in the front side and the rear side of the conveyed carrier 80. Because of this, deposition temperature differs between the cutting tool W in the front side and the rear side of the conveyed carrier 80; and the temperature difference could possibly influence the film quality of the coating film.

Contrary to that, in the deposition apparatus 100 of the present embodiment, all of the cutting tools W can be entered in the deposition region D at a constant temperature at all times by heating in the heating region H. Thus, the coating treatment can be performed under the constant temperature condition. Therefore, dispersion of the quality of the coating film in each of cutting tools W is suppressed; and the coating film can be formed with a good yield.

In addition, in the case where the heating region H is not provided to the deposition chamber 12, the temperature would be low in the start of deposition; and the temperature of the cutting tool W would sharply rise due to heat caused by the arc discharge and the bias voltage application in the deposition region D as shown as "reference configuration" in FIG. 4. Thus, the coating film is formed in the low temperature condition in the early stage of deposition; and a coating film with inferior adhesiveness and film quality would be formed possibly.

Contrary to that, in the present embodiment, coating can be performed at the optimum temperature from the early stage to completion of deposition; and the coating film with high quality can be formed.

In addition, in the present embodiment, multiple rods 82 are aligned on the conveyed carrier 80 in the standing state along the carrier conveying direction; and the cutting tools W are supported by the rods 82. Because of this, the distance between the cutting tools W passing the deposition region D and the targets (23A, 23B, 24A) is substantially kept constant. Thus, not only the deposition temperature but other deposition conditions become substantially constant in each of the cutting tools W. As a result, the more uniform coating films in the film thickness direction can be formed.

In addition, in the present embodiment, the heating region H is provided in the location adjacent to the deposition region D. Thus, even in the period in which the arc discharge is halted in the deposition region D, the temperature of the atmosphere is kept by heat of the heating region H to some extent. Because of this, falling of the surface temperature of the targets 23A, 23B, 24A is suppressed. Therefore, less gas such as $N_2$ and the like adheres on the surfaces of the targets during the period in which the arc discharge is halted. As a result, occurrence of troubles in the discharging state and film quality can be suppressed when deposition is re-started.

Second Embodiment

Next, the deposition apparatus relating to the second embodiment of the present invention is explained. Explanation about the same configuration as in the first embodiment is omitted as appropriate.

Figure 5:
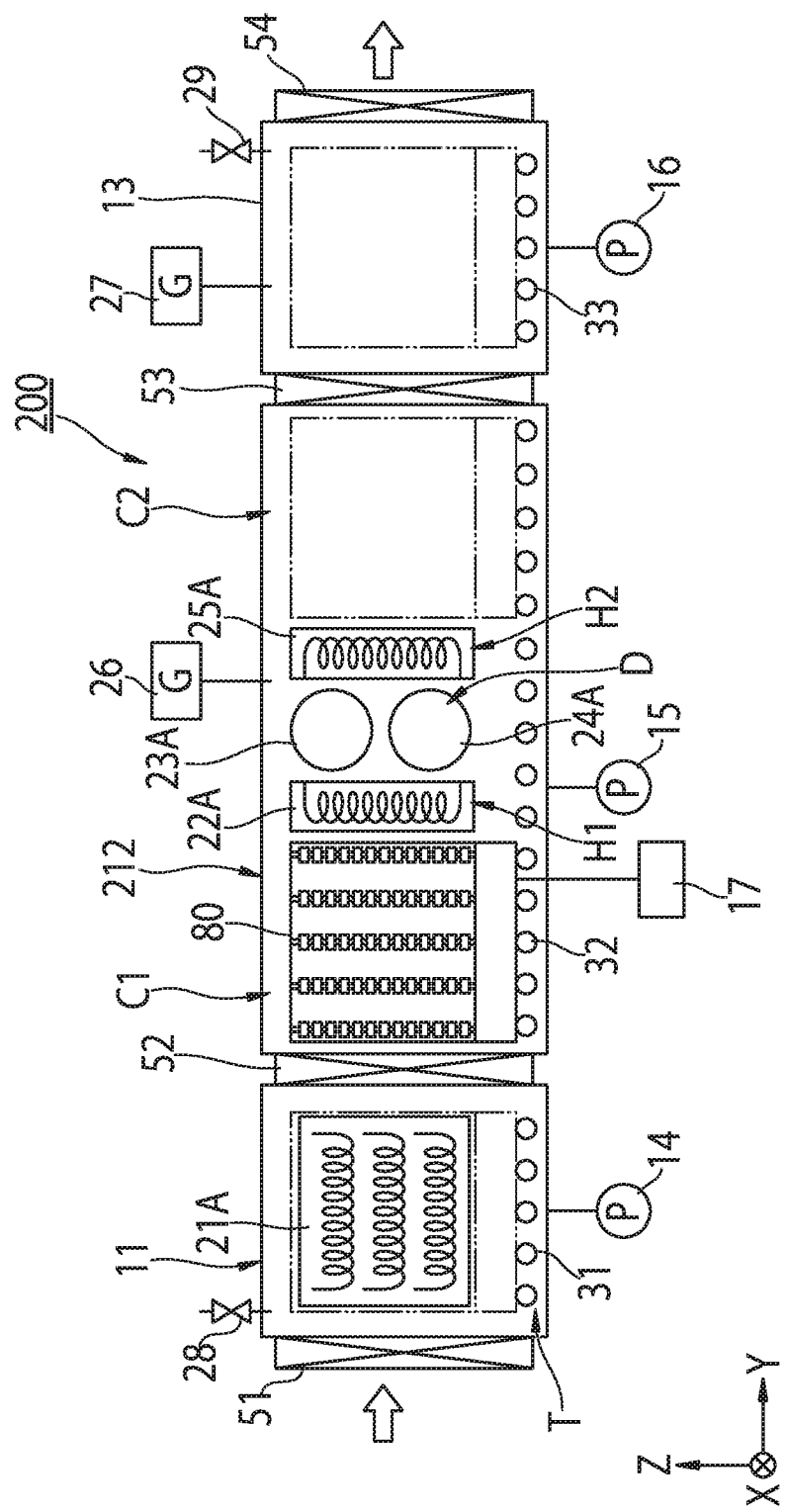
FIG. 5 is the side view showing the internal structure of the deposition apparatus relating to the second embodiment of the present invention.
Figure 6:
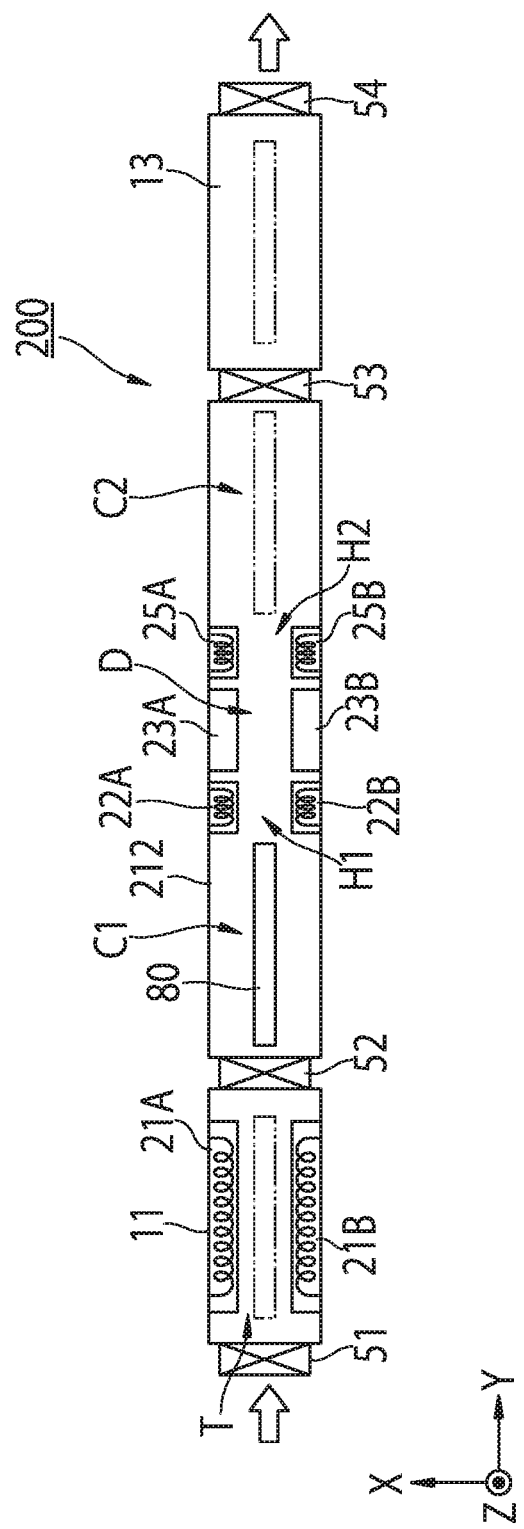
FIG. 6 is the top view showing the internal structure of the deposition apparatus relating to the second embodiment of the present invention.

FIG. 5 is the side view showing the internal structure of the deposition apparatus relating to the second embodiment of the present invention. FIG. 6 is the top view showing the internal structure of the deposition apparatus relating to the second embodiment of the present invention.

The deposition apparatus 200 of the present embodiment is the same as the deposition apparatus 100 of the first embodiment in the basic configuration, and only differs from the deposition apparatus 100 in the sense that it includes two heating regions H1, H2.

As shown in FIGS. 5 and 6, the deposition apparatus 200 includes: the pre-treatment chamber 11; the deposition chamber 212; and the post-treatment chamber 13. The pretreatment chamber 11 and the deposition chamber 212 are connected through the vacuum valve 52. The deposition chamber 212 and the post-treatment chamber 13 are connected through the vacuum valve 53. The configurations of the pre-treatment chamber 11 and the post-treatment chamber 13 are the same as the first embodiment.

The vacuum pump 15, the gas source 26, and the bias electricity source 17 are connected to the deposition chamber 212. The carrier-waiting region C1; the heating region H1; the deposition region D; the heating region H2; and the carrier-waiting region C2, are provided in the deposition chamber 212 in order along the carrier conveying line T. The configurations of the carrier-waiting regions C1, C2; and the deposition region D are the same as the first embodiment.

In the present embodiment, two heating regions H1, H2 are provided on both sides of the deposition region D.

The heating region H1 is provided on the side of the carrier-waiting region C1 with respect to the deposition region D (on the side of the direction −Y in the drawing). The heaters 22A, 22B are provided to the heating region H1 in such a way that they sandwich the carrier conveying line T. The heaters 22A, 22B heat the conveyed carrier 80 that is conveyed from the carrier-waiting region C1 to the deposition region D.

The heating region H2 is provided on the side of the carrier-waiting region C2 with respect to the deposition region D (on the side of the direction Y in the drawing). The heaters (heating apparatuses) 25A, 25B are provided to the heating region H2 in such a way that they sandwich the carrier conveying line T. The heaters 25A, 25B heat the conveyed carrier 80 that is conveyed from the carrier-waiting region C2 to the deposition region D.

As in the first embodiment, the conveyed carrier 80 during being conveyed is heated in the heating regions H1, H2 in the present embodiment. Thus, the widths of the heaters 22A, 22B, 25A, 25B in the carrier conveying direction (the direction Y) are shorter than the length of the conveyed carrier 80 (length in the direction Y). On the other hand, the heights of the heaters 22A, 22B, 25A, 25B (length in the direction Z) are roughly the same as the region in which the cutting tools W on the conveyed carrier 80 are retained.

By using the deposition apparatus 200 of the present embodiment having the configurations described above, the coating film can be deposited on the cutting tools W on the conveyed carrier 80 continuously by reciprocally moving the conveyed carrier 80 between the carrier-waiting region C1 and the carrier-waiting region C2 for the conveyed carrier 80 to pass the deposition region D.

The coating treatment in the deposition apparatus 200 of the present embodiment explained below in reference to drawings.

Since the operations of the pre-treatment chamber 11 and the post-treatment chamber 13 are the same as the first embodiment, only the coating step in the deposition chamber 212 is explained below.

FIGS. 7A to 10B are explanatory drawings of the coating step in the deposition chamber 212. FIG. 11 is an explanatory chart showing temperature change in each part on the conveyed carrier and the formation state of the coating film.

In FIGS. 7A to 10B, the locational relationship of the conveyed carrier 80; the heating regions H1, H2; and the deposition region D is shown on the left side of the drawings. On the right sides of drawings in FIGS. 7A to 10B, the temperatures of the cutting tools W in each part on the conveyed carrier 80 are shown.

In the conveyed carriers 80 shown in FIGS. 7A to 10B, the leading positon; the intermediate positon; and the tail position of the conveyed carrier 80 in the direction from the carrier-waiting region C1 to the carrier-waiting region C2 are defined as the first location 80a; the second location 80b; and the third location 80c, respectively. In the drawings, the first 80a; the second location 80b; and the third location 80c, are indicated by encircled symbols of the letters "a"; "b"; and "c", respectively (referred as the symbol a, the symbol b, and the symbol c, respectively).

In addition, in the temperature graphs on the right side of the drawings in FIGS. 7A to 10B, relative temperature relationships in the first location 80a, in the second location b, and the third location c, are shown by using the above-described symbols a, b, and c. In addition, "coating temperature upper and lower limit range" shown in the temperature graphs indicates the temperature range of the cutting tools W, in which the coating film having excellent film quality and adhesiveness can be formed. For example, when the coating film is a TiN coating film, the range is 500° C. to 600° C.

First, conveying of the conveyed carrier 80, which is introduced from the pre-treatment chamber 11 and stopped at the carrier-waiting region C1, toward the deposition region D is started as shown in FIG. 7. At this time, the first location 80a to the third location 80c are kept at a uniform temperature. In addition, the operations of the heaters 22A, 22B of the heating region H1; and the heaters 25A, 25B of the heating region H2 are started. On the other hand, the deposition region D is in the state where its operation is halted.

Figure 7A:
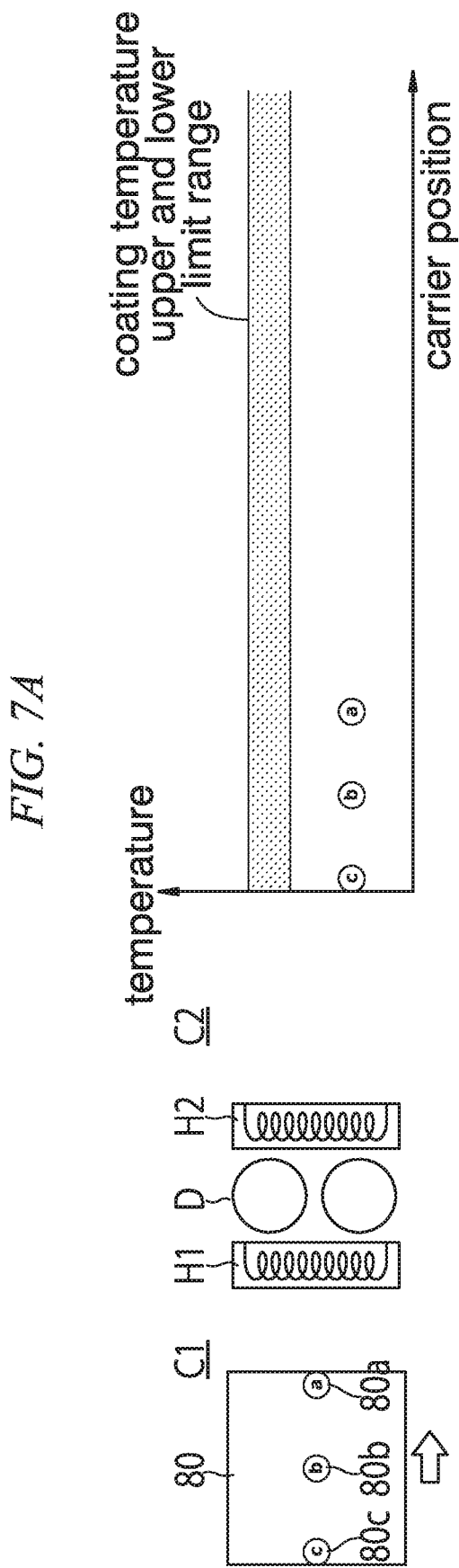
FIG. 7A is an explanatory drawing of the coating step in the deposition chamber.
Figure 7B:
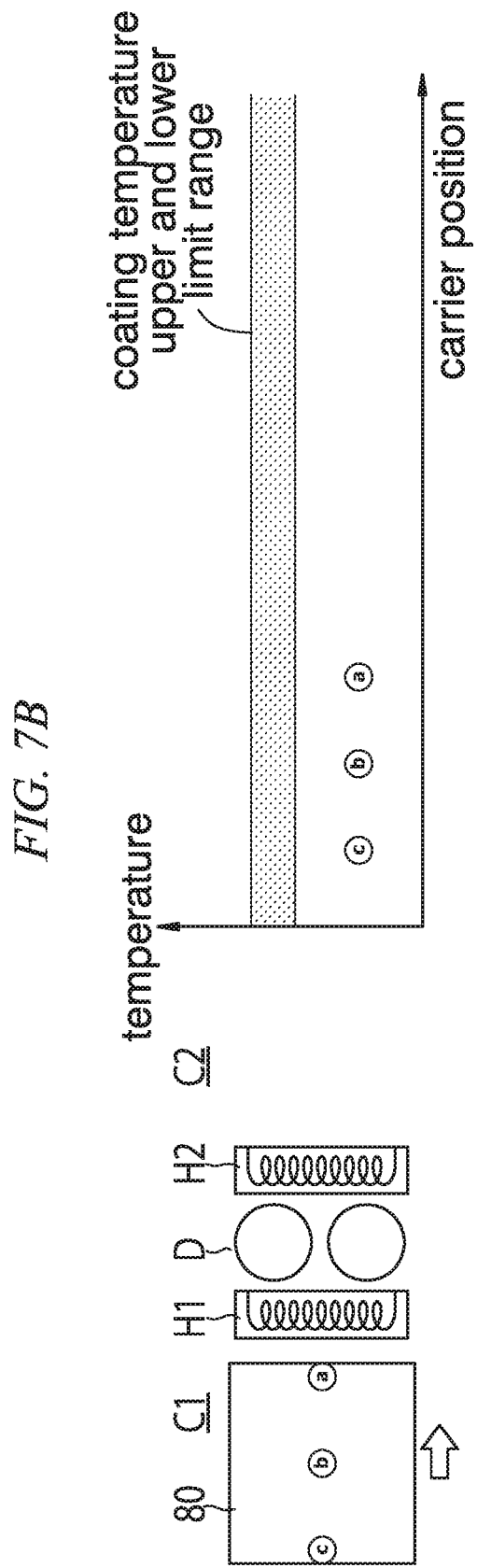
FIG. 7B is an explanatory drawing of the coating step in the deposition chamber.

After starting of conveying, the temperature at each location on the conveyed carrier 80 is not changed until the conveyed carrier 80 enters into the heating region H1 as shown in FIG. 7B.

Next, when the conveyed carrier 80 enters into the heating region H1 as shown in FIG. 7C, the cutting tools W are heated by the heaters 22A, 22B; and the temperature at the first location 80a on the leading position side rises. The cutting tools W on the first location 80a is heated to the temperature of the lower limit of the temperature range suitable for coating film formation or more at least, during the first location 80a passing the heating region H1. In addition, arc discharge is started in the deposition region D; and the deposition region D is put in the state capable of deposition, before the first location 80a passes through the heating region H1.

Figure 8A:
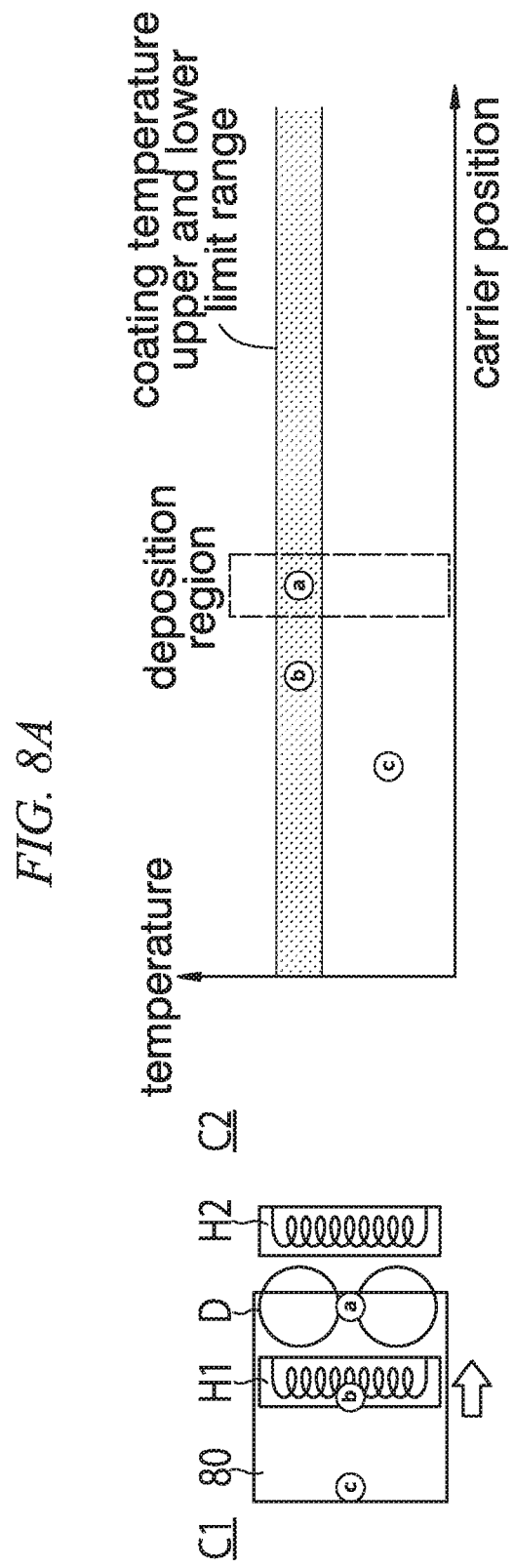
FIG. 8A is an explanatory drawing of the coating step in the deposition chamber.

After the conveyed carrier 80 is conveyed further, the first location 80a enters into the deposition region D as shown in FIG. 8A; and the coating film is formed on the cutting tools W. At this time, the second location 80b enters into the heating region H1; and the cutting tools W at the second location 80a are heated to the temperature suitable for deposition too during passing through the heating region H1.

Next, the second location 80b enters into the deposition region D as shown in FIG. 8B; and deposition on the cutting tools W at the second location 80b is performed. At this time, the third location 80c in the tail position side enters into the heating region H1; and the cutting tools W at the third location 80c are heated to the temperature suitable for deposition too during passing through the heating region H1. On the other hand, the first location 80a of the conveyed carrier 80 passes through the deposition region D and enters into the heating region H2. At this time, the temperature at the first location 80a is kept in the range suitable for deposition since the heaters 25A, 25B of the heating region H2 are in operation.

Figure 8C:
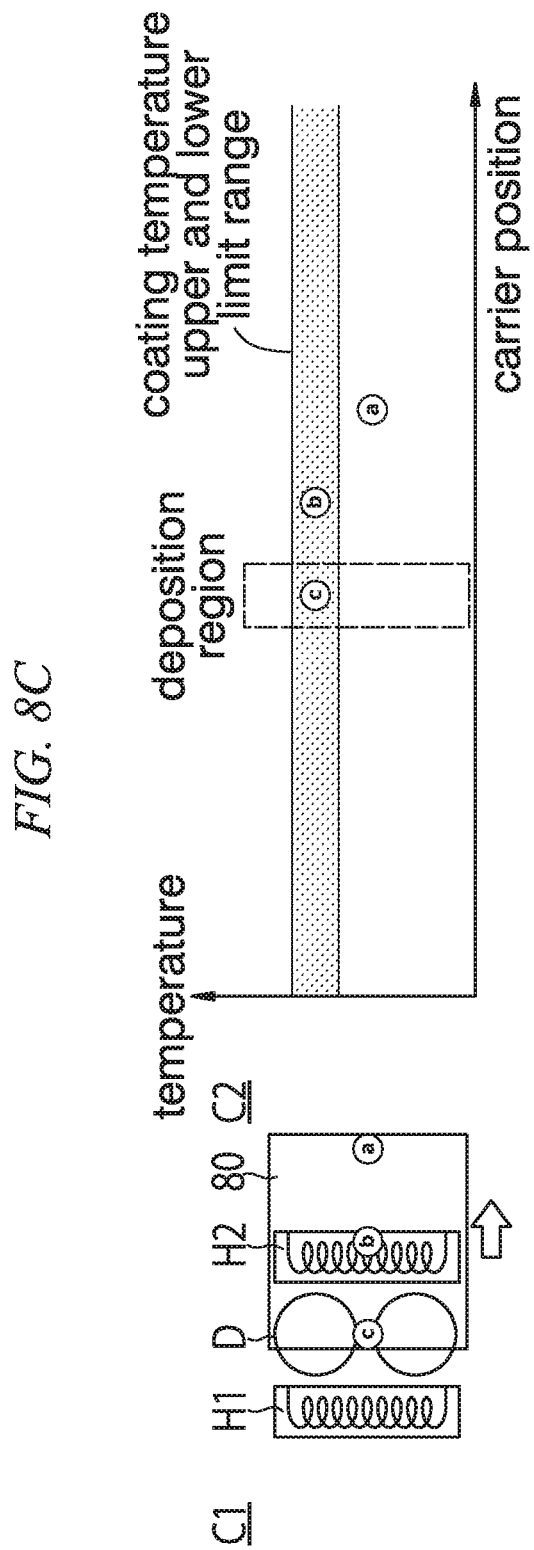
FIG. 8C is an explanatory drawing of the coating step in the deposition chamber.

Next, the third location 80c enters into the deposition region D as shown in FIG. 8C; and deposition on the cutting tools W at the third location 80c is performed. The second location 80b is heated in the heating region H2, and kept in the temperature range suitable for deposition.

On the other hand, the temperature at the first location 80a falls since the first location 80a is positioned in the carrier-waiting region C2 after passing through the heating region H2.

Next, the conveying direction of the conveyed carrier 80 is reverted when the third location 80c reached to a predetermined location in the deposition region D. In other words, the conveying direction of the conveyed carrier 80 is changed to the direction from the carrier-waiting region C2 toward the carrier-waiting region C1. At this time, the heating regions H1, H2 and the deposition region D are kept in operation without being halted.

The switching of the traveling direction of the conveyed carrier 80 may be performed when the third location 80c passes through the deposition region D.

When the conveying direction of the conveyed carrier 80 is reverted, the coating film is formed in the third location 80c continuously. The third location 80c re-enters into the deposition region D substantially with no temperature change since the third location 80c turns around on the front side of the heating region H2; and deposition is performed at the temperature suitable for deposition. In addition, the second location 80*b* is heated at the heating region H2 at this time.

Figure 9A:
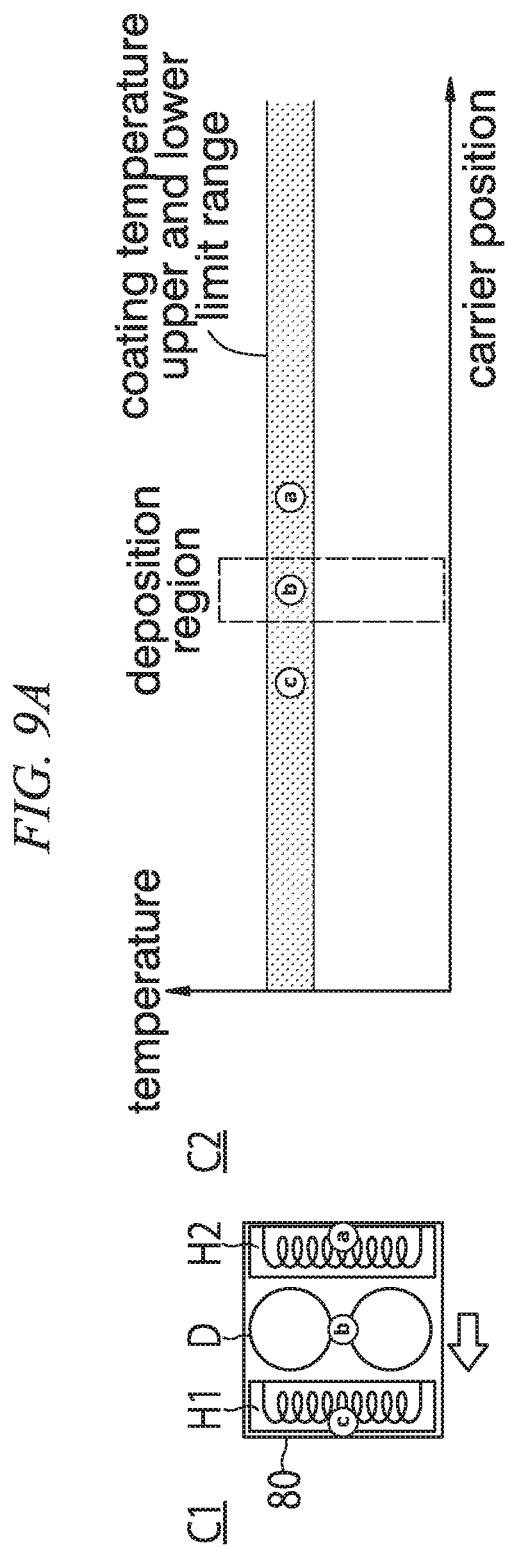
FIG. 9A is an explanatory drawing of the coating step in the deposition chamber.

Next, when the conveyed carrier 80 moves to the side of the carrier-waiting region C1, the second location 80*b* enters into the deposition region D as shown in FIG. 9A. Since the second location 80*b* is heated in the heating region H2, the coating film is formed in the suitable temperature condition. At this time, the first location 80*a* is positioned in the heating region H2 and heated by the heaters 25A, 25B. The temperature at the first location 80*a* fell in the time point shown in FIG. 8C. However, the first location 80*a* is re-heated in the heating region H2 and returned to the temperature suitable for deposition.

Figure 9B:
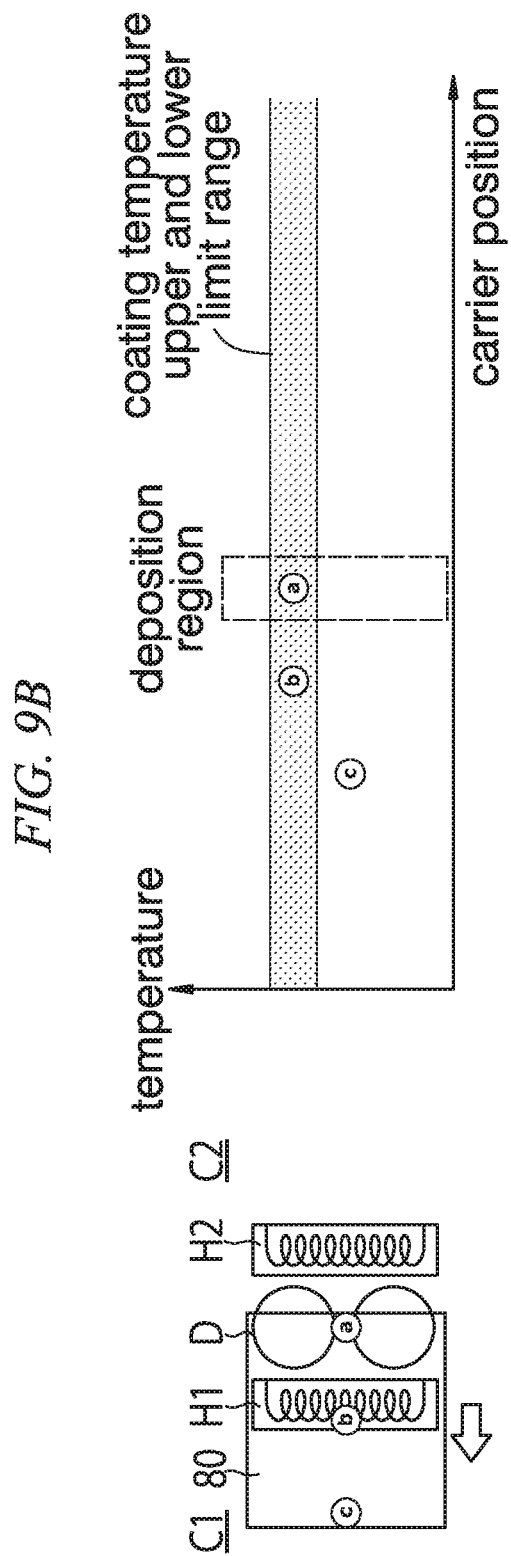
FIG. 9B is an explanatory drawing of the coating step in the deposition chamber.

Next, when the conveyed carrier 80 moves further to the side of the carrier-waiting region C1, the first location 80*a* enters into the deposition region D as shown in FIG. 9B. Since the first location 80*a* is heated in the heating region H2, the coating film is formed in the suitable temperature condition. At this time, the second location 80*b* is positioned in the heating region H1 and heated by the heaters 22A, 22B. On the other hand, the temperature at the third location 80*c* falls since the third location 80*c* is positioned in the carrier-waiting region C1 after passing through the heating region H1.

Next, the conveying direction of the conveyed carrier 80 is reverted when the first location 80*a* reached to a predetermined location in the deposition region D. In other words, the conveying direction of the conveyed carrier 80 is changed to the direction from the carrier-waiting region C1 toward the carrier-waiting region C2. The heating regions H1, H2 and the deposition region D are kept in operation without being halted.

The switching of the traveling direction of the conveyed carrier 80 may be performed when the first location 80*a* passes through the deposition region D.

When the conveying direction of the conveyed carrier 80 is reverted, the coating film is formed in the first location 80*a* continuously. The first location 80*a* re-enters into the deposition region D substantially with no temperature change since the first location 80*a* turns around on the front side of the heating region H1; and deposition is performed at the temperature suitable for deposition. In addition, the second location 80*b* is heated at the heating region H1 at this time.

Figure 9C:
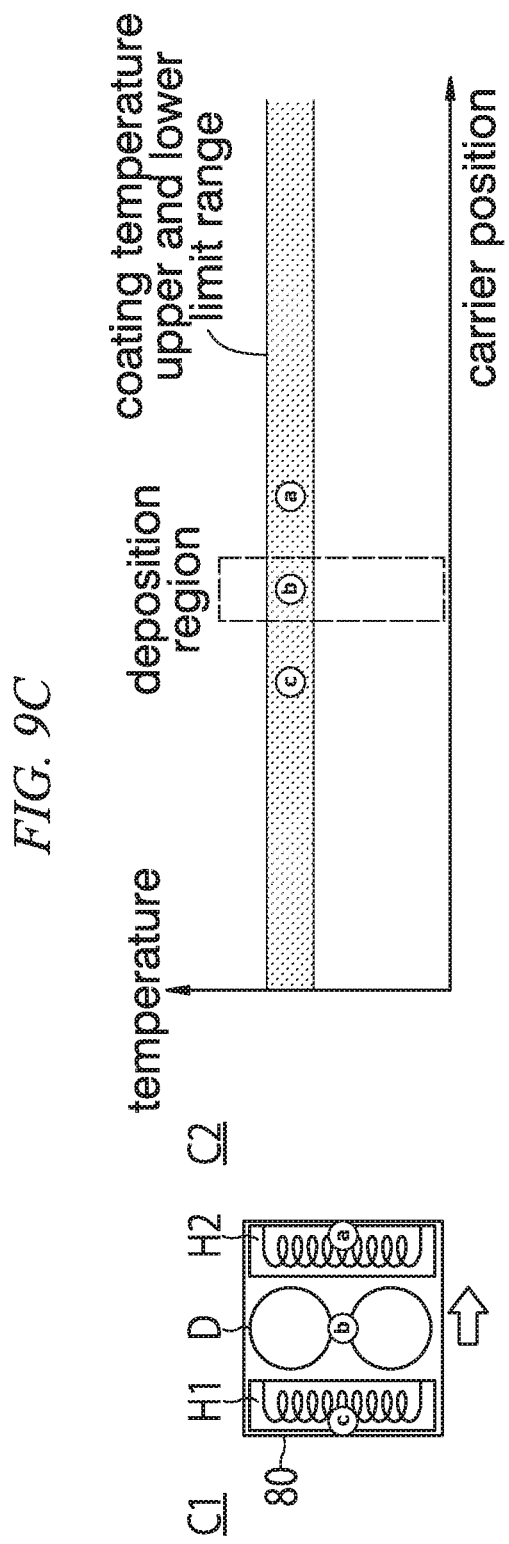
FIG. 9C is an explanatory drawing of the coating step in the deposition chamber.

Next, when the conveyed carrier 80 moves to the side of the carrier-waiting region C2, the second location 80*b* enters into the deposition region D as shown in FIG. 9C. Since the second location 80*b* is heated in the heating region H1, the coating film is formed in the suitable temperature condition. At this time, the third location 80*c* is positioned in the heating region H1 and heated by the heaters 22A, 22B. The temperature at the third location 80*c* fell in the time point shown in FIG. 9B. However, the third location 80*c* is re-heated in the heating region H1 and returned to the temperature suitable for deposition.

Figure 10A:
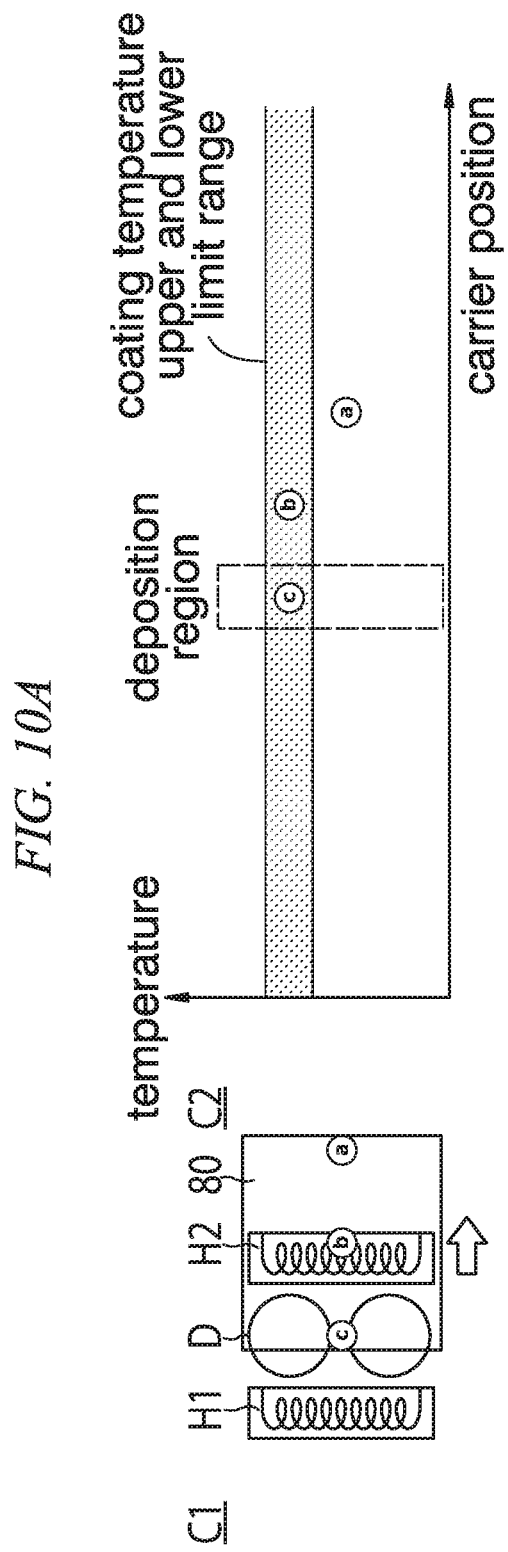
FIG. 10A is an explanatory drawing of the coating step in the deposition chamber.
Figure 10B:
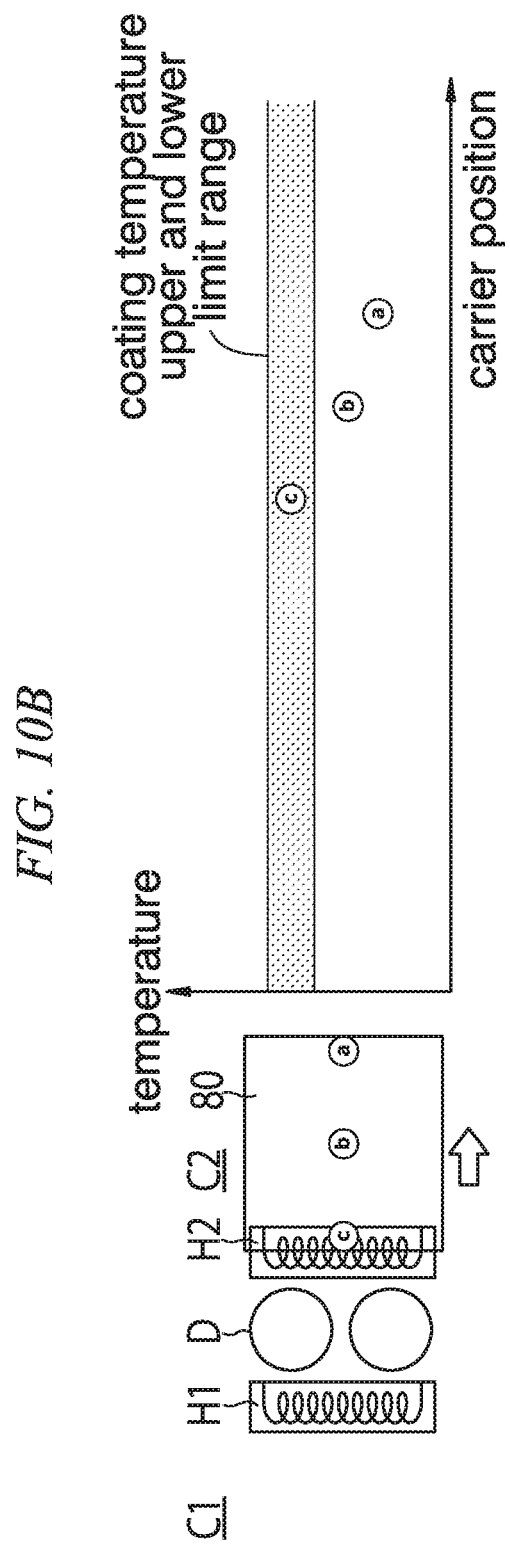
FIG. 10B is an explanatory drawing of the coating step in the deposition chamber.
Figure 11:
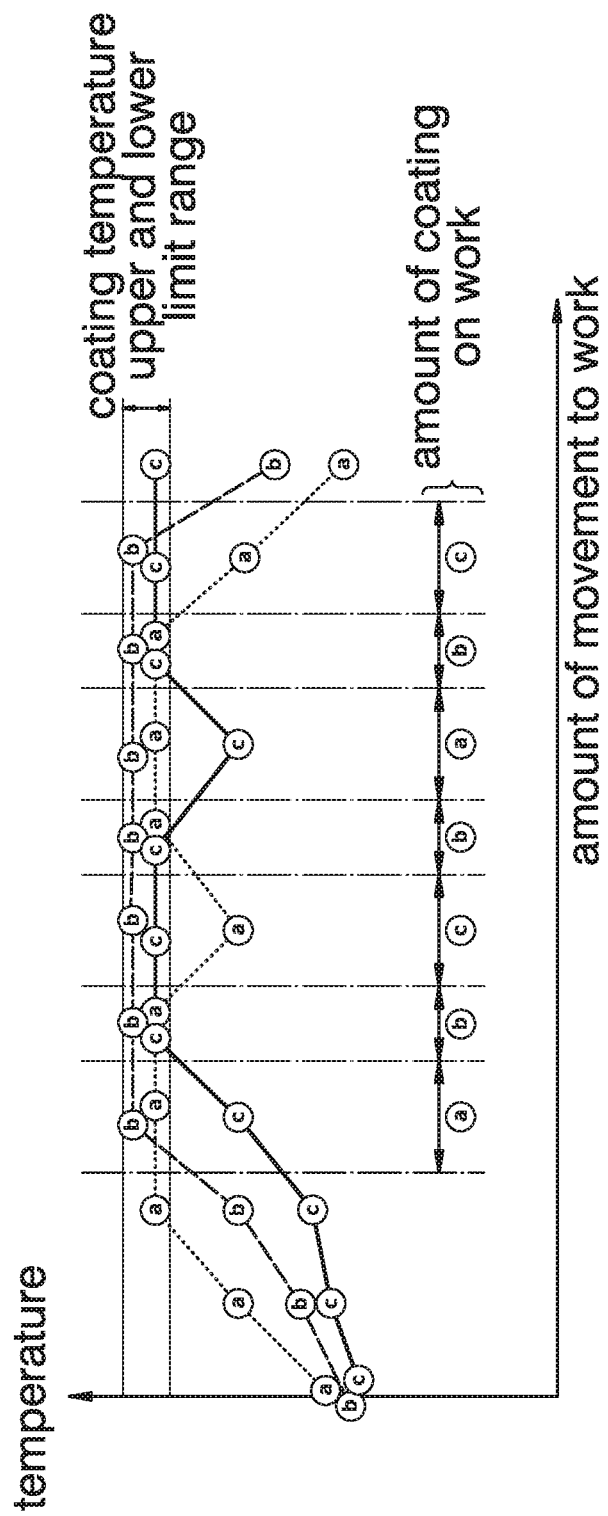
FIG. 11 is an explanatory chart showing temperature change in each part on the conveyed carrier and the formation state of the coating film.

Next, when the conveyed carrier 80 moves further to the side of the carrier-waiting region C2, the third location 80*c* enters into the deposition region D as shown in FIG. 10A. Since the third location 80*c* is heated in the heating region H1, the coating film is formed in the suitable temperature condition. At this time, the second location 80*b* is heated in the heating region H2 and kept at a constant temperature. On the other hand, the temperature at the first location 80*a* falls since the first location 80*a* is positioned in the carrier-waiting region C2 after passing through the heating region H2.

Next, the conveyed carrier 80 is conveyed to the carrier-waiting region C2. At the second location 80*b* and the third location 80*c*, the temperature is kept during passing the heating region H2. However, when the second location 80*b* and the third location 80*c* enter into the carrier-waiting region C2, the temperature starts to fall.

By following the processes described above, the coating treatment in the deposition chamber 212 is completed. After the coating treatment, the conveyed carriers 80 are taken out to the post-treatment chamber 13, and subjected to the cooling treatment.

In the present embodiment, the traveling direction is switched in the time point where the second location 80*b* of the conveyed carrier 80 is positioned in the heating region H2 or the heating location H1; and the tail position of the conveyed carrier 80 is positioned in the deposition region D as shown in FIGS. 8C and 9B. Thus, the temperature at the second location 80*b* (symbol b) is kept in the suitable temperature range at all times as shown in FIG. 11. On the other hand, the traveling direction is reverted during deposition at the first location 80*a* and the third location 80*c*. Thus, by looking at the entire coating treatment, deposition is performed two times in the first location 80*a* (symbol a) and the third location 80*c* (symbol c), which is less than three times performed at the second location 80*b*.

The film thickness distribution can be adjusted by adjusting the switching time of the traveling direction of the conveyed carrier 80, as shown in FIG. 11. Specifically, by increasing the stop time of the conveyed carrier 80 in switching of the first location 80*a* and the third location 80*c* during deposition period, the deposition time on the first location 80*a* and 80*c* is increased. Alternatively, the deposition time of the second location 80*b* is decreased by increasing the conveying speed of the conveyed carrier 80 during the second location 80*b* passing the deposition region D. The coating film can be formed in a uniform layer thickness over the entire conveyed carrier 80, by performing such an operation for the deposition time at the first location 80*a* and the third location 80*c* to be 1.5-times of the deposition time at the second location 80*b*, for example.

In the explanation described above, the case where the traveling direction of the conveyed carrier 80 is changed twice and the conveyed carrier 80 passes the deposition region D three times is explained. However, the reciprocal movement of the conveyed carrier 80 can be repeated as needed.

As explained in detail above, according to the deposition apparatus 200, the conveyed carrier 80 passes the deposition region D multiple times by reciprocally moving the conveyed carrier 80 in the deposition chamber 212. Because of this, the coating film having intended film thickness can be formed efficiently.

In addition, in the present embodiment, the heating regions H1, H2 are provided on both sides of the deposition region D. Because of this: the conveyed carrier 80 introduced from the carrier-waiting region C1 to the deposition region D is subjected to the coating treatment immediately after heating by the heating region H1; and the conveyed carrier 80 introduced from the carrier-waiting region C2 to the deposition region D is subjected to the coating treatment immediately after heating by the heating region H2. In other words, the cutting tools W, which are subjected to the coating treatment in the deposition region D, can be kept in the suitable temperature range at all times. Thus, according to the present embodiment, the coating film having excellent film quality can be laminated on the cutting tools W continuously.

In the present embodiment, the fallen temperature after moving outside of the heating regions H1, H2, such as at the first location 80a shown in FIG. 8C; and the third location 80c shown in FIG. 9C, can be re-raised. Thus, each layer of the laminated-structured coating film can be formed under the optimum temperature condition.

Contrary to that, without the heating regions H1, H2, the temperature of the cutting tools W moving outside of the deposition region D falls significantly; and re-raising the temperature becomes harder. Thus, the following deposition is started in the condition where the temperature of the cutting tools W is low. In this case, a layer deposited under a non-optimum temperature condition would be included in the laminated-structured coating film.

In addition, in the present embodiment, the temperature of the cutting tools W during deposition can be controlled freely by the temperature setting of the heating regions H1, H2.

In the case where there is no heating region in the deposition chamber, when the cutting tools W enters into the deposition region D, the temperature rises rapidly; and the rising becomes gradual in a certain temperature range as shown by "reference configuration" in FIG. 4. Thus, the temperature of the cutting tools W is determined by the deposition condition such as the bias voltage and the like; and it is almost impossible to control freely.

Contrary to that, in the present embodiment, the cutting tools W always pass through the heating regions H1 or the heating region H2 before deposition. Thus, the cutting tools W can enter into the deposition region D in the state where the temperature of the cutting tools W is adjusted to a predetermined temperature. However, even if the cutting tools W enter into the deposition region D with the above-mentioned temperature controlling, the temperature of the cutting tools W would increase in the deposition region D. Thus, the conveying speed of the conveyed carrier 80 is increased for the cutting tools W to pass the deposition region D before the temperature of the cutting tools W rises excessively. Because of this, the temperature of the cutting tools W can be controlled within the predetermined range.

As explained above, according to the present embodiment, the cutting tools W can pass the deposition region D at any temperature without changing the deposition condition such as the bias voltage and the like. Thus, according to the present embodiment, the coating film can be laminated under the deposition and temperature conditions suitable to the specific kind of the coating film.

Third Embodiment

Next, the deposition apparatus relating to the third embodiment of the present invention is explained. Explanation about the same configurations as in the first and second embodiments is omitted as appropriate.

Figure 12:
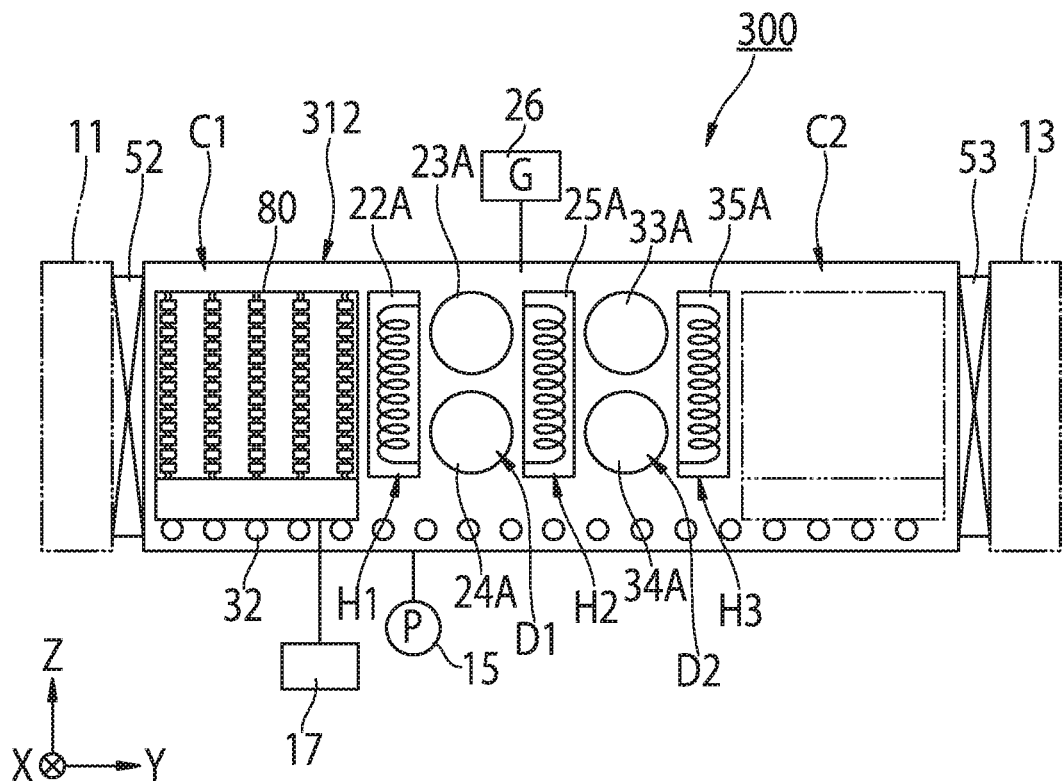
FIG. 12 is the side view showing the internal structure of the deposition apparatus relating to the third embodiment of the present invention.
Figure 13:
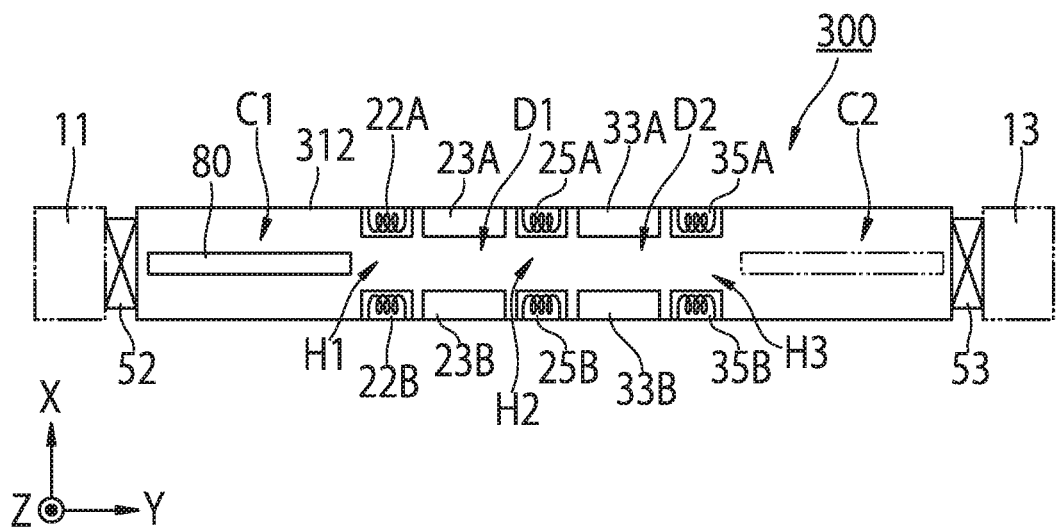
FIG. 13 is the top view showing the internal structure of the deposition apparatus relating to the third embodiment of the present invention.

FIG. 12 is the side view showing the internal structure of the deposition apparatus relating to the third embodiment of the present invention. FIG. 13 is the top view showing the internal structure of the deposition apparatus relating to the third embodiment of the present invention.

The deposition apparatus 300 of the present embodiment is the same as the deposition apparatus 200 of the second embodiment in the basic configuration, and only differs from the deposition apparatus 200 in the sense that it includes two deposition regions D1, D2; and three heating regions H1, H2, H3.

As shown in FIGS. 12 and 13, the deposition apparatus 300 includes: the pre-treatment chamber 11; the deposition chamber 312; and the post-treatment chamber 13. The pretreatment chamber 11 and the deposition chamber 312 are connected through the vacuum valve 52. The deposition chamber 312 and the post-treatment chamber 13 are connected through the vacuum valve 53. The configurations of the pre-treatment chamber 11 and the post-treatment chamber 13 are the same as the first embodiment.

The vacuum pump 15, the gas source 26, and the bias electricity source 17 are connected to the deposition chamber 312. The carrier-waiting region C1; the heating region H1; the deposition region D1; the heating region H2; the deposition region D2; the heating region H3; and the carrier-waiting region C2, are provided in the deposition chamber 312 in order along the carrier conveying line T. The configurations of the carrier-waiting regions C1, C2; and the heating regions H1, H2 are the same as the second embodiment. In addition, the configuration of the deposition region D1 is the same as the deposition region D of the second embodiment.

In the present embodiment, the deposition region D2 and the heating region H3 are provided on the side of the carrier-waiting region C2 of the heating region H2.

The deposition region D2 is the same as the deposition region D shown in FIG. 1 or the like in a basic configuration. In other words, four targets are provided to the deposition region D2. As shown in FIG. 12, two targets 33A, 34A are provided side by side in the vertical direction (the direction Z). As shown in FIG. 13, the target 33B is provided in the position facing the target 33A in the direction X across the carrier conveying line T. In addition, although it is omitted in the drawing, in the position facing the target 34A, the same type target is provided.

The arc power source, which supplies arc-discharging electrical power to the targets (33A, 33B, 34A) and is not shown in the drawing, is further provided to the deposition region D. The bias power source 17 applies bias voltage to the cutting tools W through the conveyed carrier 80 when the conveyed carrier 80 is positioned in the deposition region D1, D2 at least.

The heating region H3 is provided on the side of the carrier-waiting region C2 with respect to the deposition region D2 (on the side of the direction +Y in the drawing). The heater (heating apparatus) 35A and the heater (heating apparatus) 35B are provided to the heating region H3. The heater 35A and the heater 35B are provided facing each other in such a way that they sandwich the carrier conveying line T. The heaters 35A, 35B heat the conveyed carrier 80 that is conveyed from the carrier-waiting region C2 to the deposition region D2.

The conveyed carrier 80 during being conveyed is heated in the heating region H3. Thus, the widths of the heaters 35A, 35B in the carrier conveying direction (the direction Y) are shorter than the length of the conveyed carrier 80 (length in the direction Y). On the other hand, the heights of the heaters 35A, 35B (length in the direction Z) are roughly the same as the region in which the cutting tools W on the conveyed carrier 80 are retained.

In the deposition apparatus 300 of the present embodiment having the above-described configurations, by having the two deposition regions D1, D2, different kinds of coating films can be laminated on the cutting tools W. In addition, as in the deposition apparatus 200 of the second embodiment, the coating film can be deposited on the cutting tools W on the conveyed carrier 80 continuously by reciprocally moving the conveyed carrier 80 between the carrier-waiting region C1 and the carrier-waiting region C2 for the conveyed carrier 80 to pass the deposition region D1 or D2.

For example, when the first and the second coating films with different compositions each other are formed on the cutting tools W, they can be formed by the deposition method explained below.

First, the first coating film is formed by using the deposition region D1. In this case, the heating regions H1, H2 and the deposition region D1 are put in the operation state; and the heating region H3 and the deposition region D2 are put in the halted state. Then, the first coating film is formed by: reciprocally moving the conveyed carrier 80 in the range including the region from the heating region H1 to the heating region H2; and the conveyed carrier 80 passing through the deposition region D1 multiple times.

Then, by using the deposition region D2, the second coating film is formed on the first coating film. In this case, the heating regions H2, H3 and the deposition region D2 are put in the operation state; and the heating region H1 and the deposition region D1 are put in the halted state. Then, the second coating film is formed by reciprocally moving the conveyed carrier 80 in the range from the heating region H2 to the heating region H3; and the conveyed carrier 80 passing through the deposition region D2 multiple times.

As explained above, the different kinds of coating films are laminated on the cutting tools W by using the deposition chamber 312. In the present embodiment, the multiple kinds of coating films are laminated without taking out the cutting tools W in the open air. Thus, the coating treatment can be performed efficiently and the coating film having excellent adhesiveness between layers can be obtained.

In order to set different temperatures between the deposition regions D1 and D2, the preset temperatures of the heating regions H1, H2; and the preset temperatures of the heating regions H2, H3, may be set individually. Because of this, each of the deposition temperature in the deposition region D1 and the deposition temperature in the deposition region D2 can be set to the optimum condition; and the laminated-structured coating film having excellent film quality can be obtained.

In addition, the coating films with the same composition may be formed by using the deposition regions D1, D2 in the deposition apparatus 300.

In addition, one of the deposition regions D1, D2 may be used as a bombard region in which oxide removal on the surface of the cutting tools W is performed by colliding high speed metal ions to the cutting tools W. Normally, the bombard treatment and the coating treatment are performed in different chambers since conditions such as pressure, bias, and the like are different. In the present embodiment, the coating film is formed in the optimum temperature condition from the early stage of deposition by providing the heating regions H1 to H3. Thus, even if the bombard treatment were performed with the coating treatment in the same deposition chamber 312, the coating film would be formed without deterioration of adhesiveness and the film quality. Thus, according to the present embodiment, the deposition apparatus can be shorter compared to the case where the bombard chamber is provided separately.

Fourth Embodiment

Next, the deposition apparatus relating to the fourth embodiment of the present invention is explained. The fourth embodiment is a modified example of the third embodiment, and explanation about the same configurations as in the third embodiment is omitted as appropriate.

Figure 14:
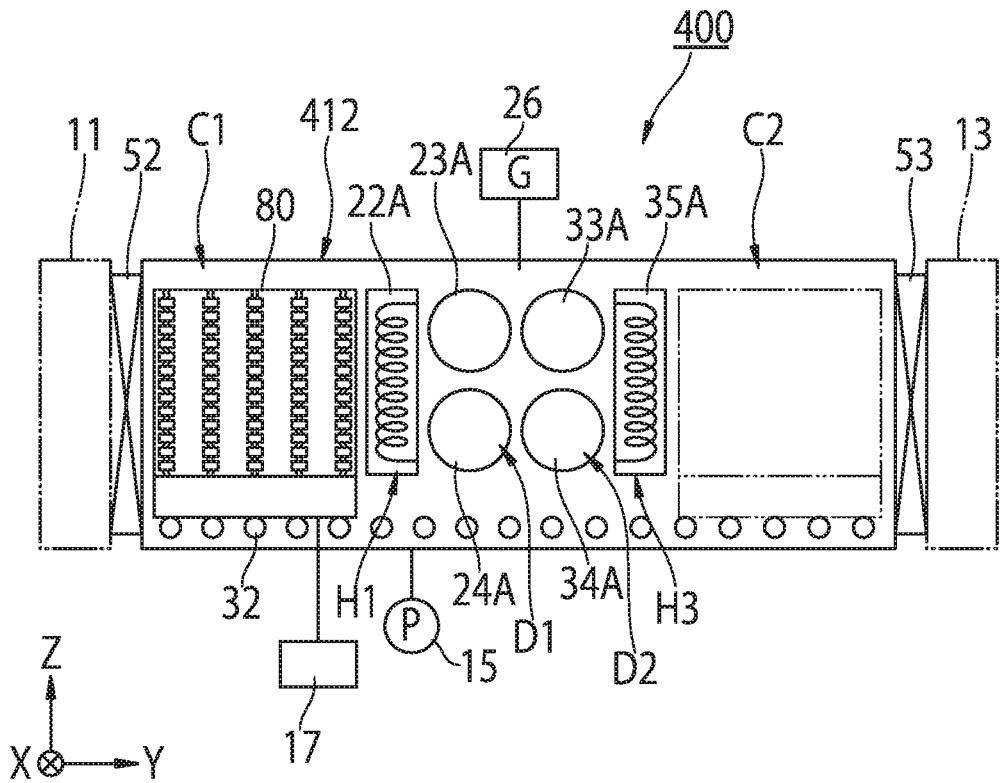
FIG. 14 is the side view showing the internal structure of the deposition apparatus relating to the fourth embodiment of the present invention.
Figure 15:
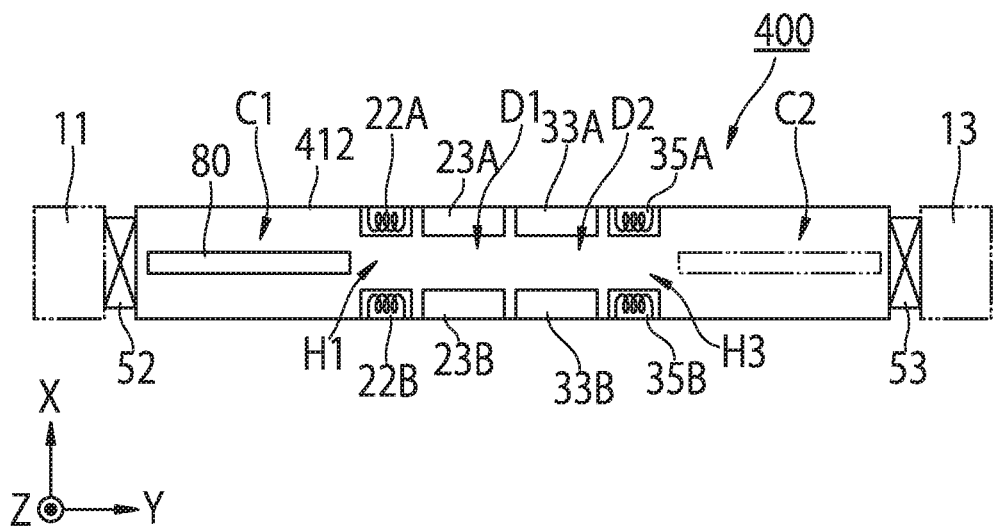
FIG. 15 is the top view showing the internal structure of the deposition apparatus relating to the fourth embodiment of the present invention.

FIG. 14 is the side view showing the internal structure of the deposition apparatus relating to the fourth embodiment of the present invention. FIG. 15 is the top view showing the internal structure of the deposition apparatus relating to the fourth embodiment of the present invention.

The deposition apparatus 400 of the present embodiment is an embodiment in which the heating region H2 is omitted; and the distance between the deposition regions D1 and D2 is shortened.

As shown in FIGS. 14 and 15, the deposition apparatus 400 includes: the pre-treatment chamber 11; the deposition chamber 412; and the post-treatment chamber 13. The pretreatment chamber 11 and the deposition chamber 412 are connected through the vacuum valve 52. The deposition chamber 412 and the post-treatment chamber 13 are connected through the vacuum valve 53. The configurations of the pre-treatment chamber 11 and the post-treatment chamber 13 are the same as the first embodiment.

The vacuum pump 15, the gas source 26, and the bias electricity source 17 are connected to the deposition chamber 412. The carrier-waiting region C1; the heating region H1; the deposition region D1; the deposition region D2; the heating region H3; and the carrier-waiting region C2, are provided in the deposition chamber 412 in order along the carrier conveying line T. The configurations of the carrier-waiting regions C1, C2; the deposition regions D1, D2; and the heating regions H1, H3 are the same as the third embodiment.

In the deposition apparatus 400, different kinds of coating films can be laminated and formed on the cutting tools W. For example, when the laminated film made of the first and the second coating films is formed, the first coating film is formed by using the heating regions H1, H3 and the deposition region D1; and the second coating film is formed by using the heating regions H1, H3 and the deposition region D2. In addition, as in the third embodiment, one of the deposition regions D1, D2 may be used as the bombard region.

In the deposition apparatus 400 of the present embodiment, by omitting the heating region H2, the length of the deposition chamber 412 can be shorter compared to the deposition apparatus 300 of the third embodiment; and the deposition apparatus can be down-sized. It is preferable to keep the deposition region provided between the two heating regions H1 and H3 to the equivalent length of the width of the conveyed carrier 80 or less as a whole (length in the direction Y). Because of this, the coating film can be formed easily in the state where the optimum temperature condition is maintained.

In the present embodiment, three or more deposition regions may be provided between the two heating regions H1, H3. However, when a long deposition region is provided between the heating regions H1 and H3, the temperature falls in the period from being heated by the heating regions H1, H3 to being deposited; and the temperature deviated from the optimum temperature condition easily due to temperature raise by the bias voltage. Thus, it is preferable that the number of the deposition regions provided between the two heating regions is 3 or less. More preferably, it is 2 or less.

MODIFIED EXAMPLE

Figure 16A:
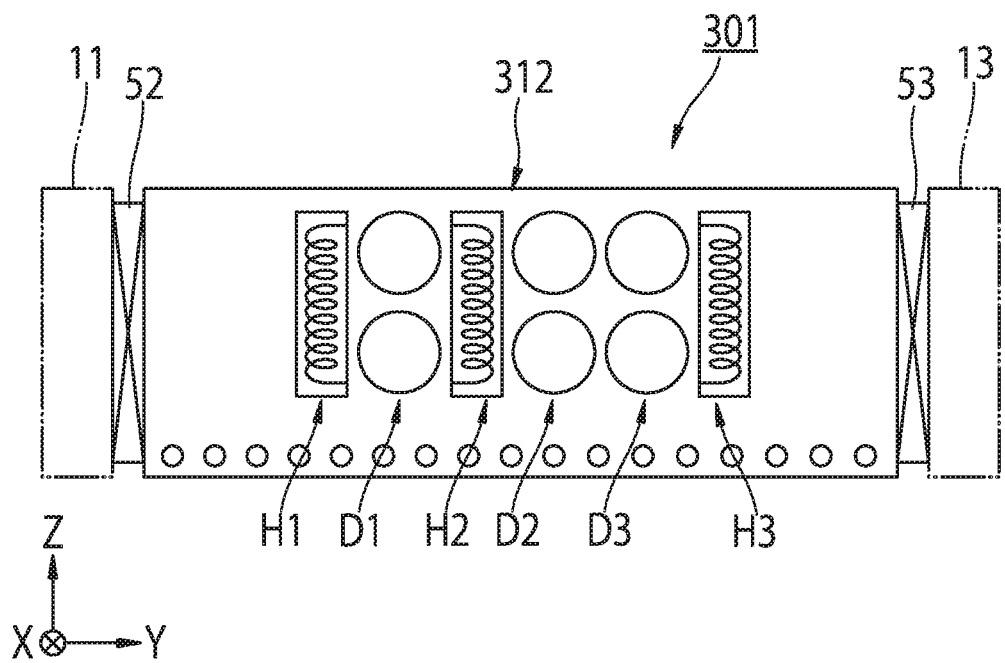
FIG. 16A is a schematic drawing showing the deposition apparatus relating to the modified example of the present invention.

FIG. 16A is a schematic drawing showing the deposition apparatus relating to the modified example of the present invention.

In the configuration of the deposition apparatus 301 shown in FIG. 16A, the arrangement of the heating region and the deposition region is changed in the deposition apparatus 300 of the third embodiment. In FIG. 16A, components that are unnecessary for the explanation are omitted as appropriate.

In the deposition apparatus 301, multiple deposition regions D2, D3 are provided between the heating region H2 and the heating region H3 as in the fourth embodiment. In this case, one of the deposition regions D1 to D3 may be used as the bombard region.

Figure 16B:
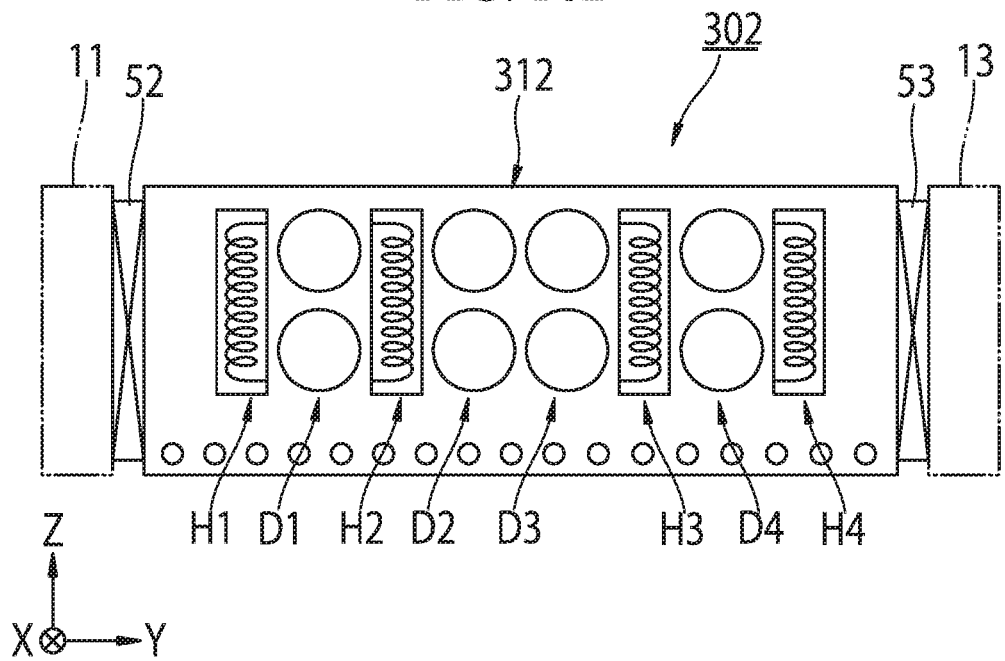
FIG. 16B is a schematic drawing showing the deposition apparatus relating to the modified example of the present invention.

FIG. 16B is a schematic drawing showing the deposition apparatus relating to the modified example of the present invention.

In the configuration of the deposition apparatus 302 shown in FIG. 16B, the arrangement of the heating region and the deposition region is changed in the deposition apparatus 300 of the third embodiment. In FIG. 16B, components that are unnecessary for the explanation are omitted as appropriate.

In the deposition apparatus 302, four heating regions H1 to H4 and four deposition regions D1 to D4 are provided. The deposition region D1 is provided between the heating region H1 and the heating region H2. The deposition regions D2, D3 are provided between the heating region H2 and the heating region H3. The deposition regions D4 is provided between the heating region H3 and the heating region H4. In this case, one of the deposition regions D1 to D4 may be used as the bombard region.

In the second modified example, the deposition region sandwiched by two heating regions, it is preferable to keep the length of the entire deposition region to the equivalent length of the width (length in the direction Y) of the conveyed carrier 80 or less. Specifically, in regard to the deposition regions D2, D3 sandwiched by the two heating regions shown in FIG. 16B, preferably, the total length of the deposition regions D2, D3 (entire length in the carrier conveying direction) is kept to equivalent to the width of the conveyed carrier 80 or less.

In addition, in the second modified example, three or more of deposition regions may be provided between the closely located two heating regions (for example, the heating regions H2, H3). However, if the distance between the heating regions became too long, temperature control on the cutting tools W would be harder. Thus, it is preferable that the number of the deposition regions provided between the heating regions is 3 or less. More preferably, it is 2 or less.

INDUSTRIAL APPLICABILITY

The condition for formation of the coating film can be controlled more strictly by reducing the temperature fluctuation during deposition of the coating film of the cutting tool. Because of this, the high quality cutting tool can be produced stably.

REFERENCE SIGNS LIST

D, D1, D2: Deposition region
H, H1, H2, H3: Heating region
W: Cutting tool
11: Pre-treatment chamber
12, 212, 312, 412: Deposition chamber
13: Post-treatment chamber
22A, 22B, 25A, 25B, 35A, 35B: Heater (heating apparatus)
23A, 23B, 24A, 33A, 33B, 34A: Target
31-33: Roller conveyer (carrier apparatus)
52, 53: Vacuum valve
100, 200, 300, 400: Deposition apparatus

What is claimed is:

1. A deposition method for forming a coating film on a surface of a cutting tool by using an in-line deposition apparatus for a cutting tool with a coating film including:
a single in-line deposition chamber in which a first carrier-waiting region, a first heating region, a deposition region, a second heating region and a second carrier-waiting region are provided in an order, and a coating film is formed on the cutting tools, the in-line deposition chamber being free of a vacuum valve therein;
a pre-treatment chamber and post-treatment chamber, each of which is connected to the deposition chamber through a vacuum valve; and
a conveying line that conveys the cutting tools from the pre-treatment chamber to the post-treatment chamber going through the deposition chamber, the in-line deposition apparatus using a conveyed carrier on which a plurality of rods supporting cutting tools is provided in a standing state along a first conveying direction,
the deposition method comprising the steps of:
mounting the cutting tools on the conveyed carrier;
sending the conveyed carrier holding the cutting tools before forming a coating film in the in-line deposition chamber; and
reciprocally moving the conveyed-carrier in the in-line deposition chamber in the first conveying direction and a second conveying direction opposite to the first conveying direction, the conveyed-carrier being moved from the first carrier-waiting region to the second carrier-waiting region in moving in the first conveying direction and from the second carrier-waiting region to the first carrier-waiting region in moving in the second conveying direction, and the cutting tools being heated to a predetermined temperature suitable for coating at an end of the first heating region in the first conveying direction and at an end of the second heating region in the second conveying direction;
temporarily stopping the conveyed-carrier in one of the first and second carrier-waiting regions,
wherein
targets are provided to the deposition region sandwiching the conveying line from sides, and heaters are provided to each of the heating regions sandwiching the conveying line from sides.

2. The deposition method for forming a coating film on a cutting tool according to claim 1, wherein a multi-layered coating layer is formed on the cutting tools by providing a plurality of deposition regions; and having the conveyed carrier pass the plurality of deposition regions in order.

3. The deposition method for forming a coating film on a cutting tool according to claim 2, wherein the conveyed carrier alternatingly passes the plurality of heating regions and the plurality of deposition regions in the first and second conveying directions of the conveyed carrier.

4. The deposition method for forming a coating film on a cutting tool according to claim 1, wherein the coating layer is deposited while the cutting tools are rotated on the conveyed carrier.

* * * * *